United States Patent [19]
Yamaji et al.

[11] Patent Number: 5,995,819
[45] Date of Patent: Nov. 30, 1999

[54] FREQUENCY CONVERTER AND RADIO RECEIVER USING SAME

[75] Inventors: Takafumi Yamaji, Yokohama; Osamu Watanabe, Chigasaki; Hiroshi Tanimoto, Kawasaki; Tetsuro Itakura, Tokyo-to; Shoji Otaka, Yokohama; Ryuichi Fujimoto, Tokyo-to, all of Japan

[73] Assignee: Kabushiki Kaisha Toshiba, Kawasaki, Japan

[21] Appl. No.: 08/755,468

[22] Filed: Nov. 22, 1996

[30] Foreign Application Priority Data

Nov. 22, 1995 [JP] Japan .................................... 7-304338

[51] Int. Cl.⁶ ................................................... H04B 1/00
[52] U.S. Cl. ............................................ 455/326; 455/333
[58] Field of Search ............................... 455/20, 118, 130, 455/169.2, 180.4, 191.2, 193.3, 190.1, 236.1, 311, 313, 317, 318, 323, 326, 332, 330, 333; 331/37, 38; 327/105, 113

[56] References Cited

U.S. PATENT DOCUMENTS

| | | | |
|---|---|---|---|
| 4,937,516 | 6/1990 | Sempel | 323/315 |
| 5,065,300 | 11/1991 | Jacobsen et al. | 363/16 |
| 5,113,094 | 5/1992 | Grace et al. | 327/119 |
| 5,298,870 | 3/1994 | Cystera et al. | 331/177 R |
| 5,448,772 | 9/1995 | Grandfield | 455/333 |
| 5,465,415 | 11/1995 | Bien | 455/326 |
| 5,563,921 | 10/1996 | Mesuda et al. | 375/376 |
| 5,570,056 | 10/1996 | Groe | 455/326 |
| 5,595,302 | 1/1997 | Matracola et al. | 331/177 R |
| 5,602,504 | 2/1997 | Liu | 455/333 |
| 5,630,228 | 5/1997 | Mittel | 455/326 |
| 5,634,207 | 5/1997 | Yamaji et al. | 455/323 |
| 5,708,399 | 1/1998 | Fuji et al. | 455/333 |
| 5,715,532 | 2/1998 | Sagawa et al. | 455/333 |

FOREIGN PATENT DOCUMENTS

H08-088577 4/1996 Japan .............................. H04B 1/26

*Primary Examiner*—Reinhard J. Eisenzopf
*Assistant Examiner*—Makoto Aoki
*Attorney, Agent, or Firm*—Foley & Lardner

[57] ABSTRACT

A frequency converter includes: a signal synthesizer element for inputting first and second input signals to synthesize these signals and for outputting a synthesized signal, from which noises even times as large as the frequency of the second input signal are removed; an amplitude limitation amplifier element, composed of a differential amplifier circuit, for amplifying the synthesized signal outputted from the signal synthesizer element to output an amplified signal having a constant amplitude; and a filter for inputting the amplified signal outputted from the amplitude limitation amplifier element, to remove an unnecessary signal component to produce an output a baseband signal including only a desired signal component. In addition, a radio receiver using the frequency converter of such a construction is designed to input the output of a local oscillator to a variable attenuator or a variable gain amplifier, to input the output of the variable attenuator or the variable gain amplifier as the first input signal to the frequency converter so as to perform the gain control. Thus, not only is self-mixing, a common problem in direct conversion receivers, prevented, but also, because a smaller local oscillation driving signal is required, power consumption is significantly reduced.

18 Claims, 38 Drawing Sheets

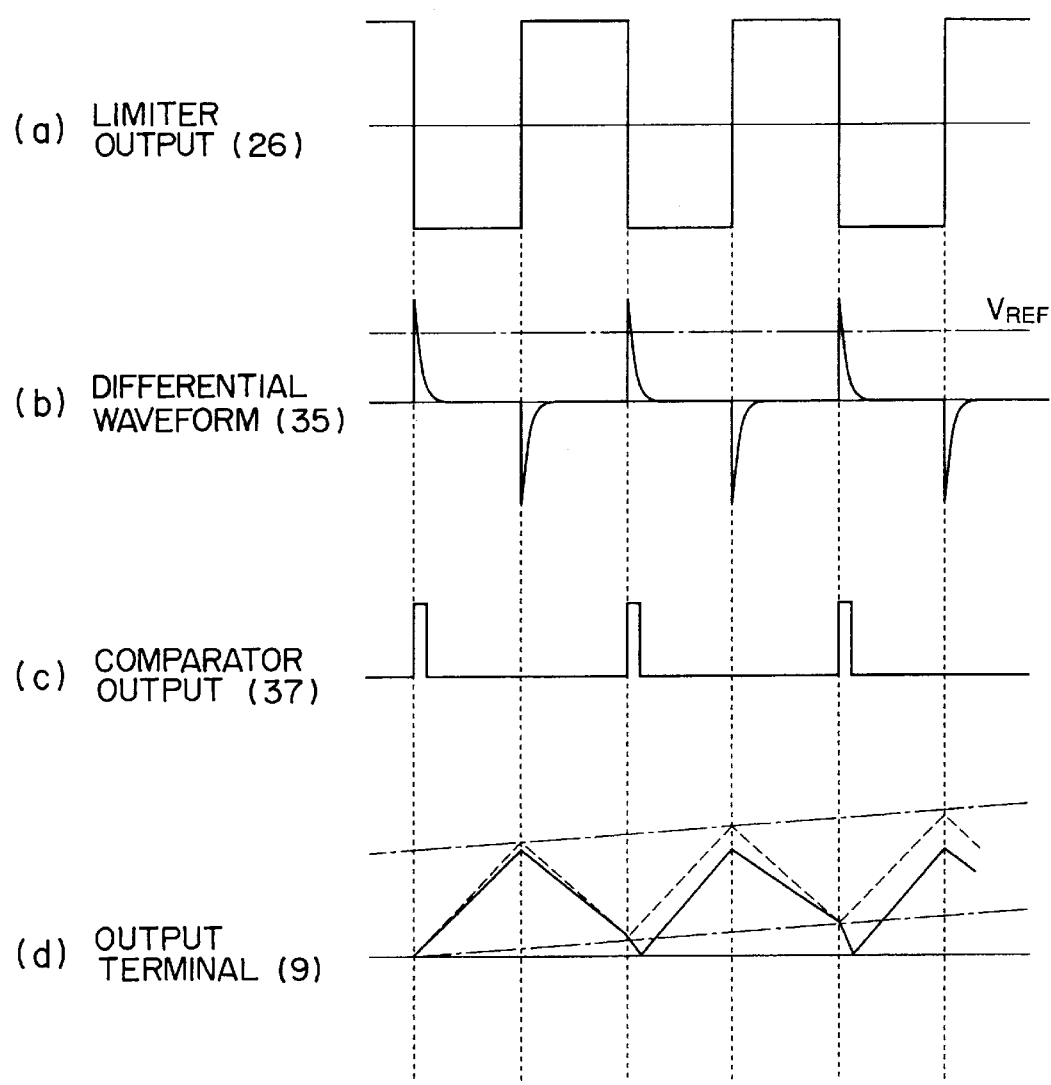
F I G. 10

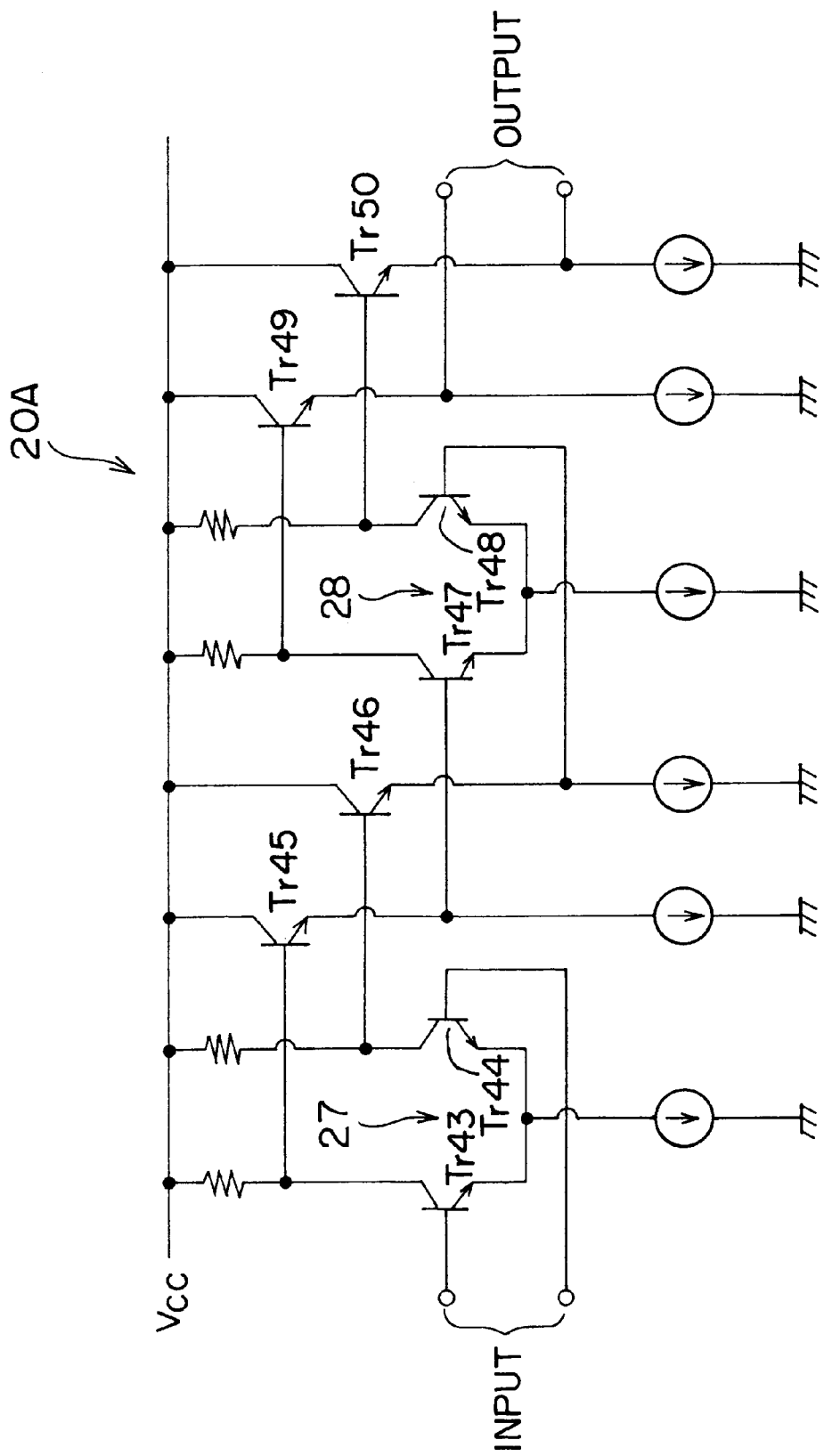
F I G. 13

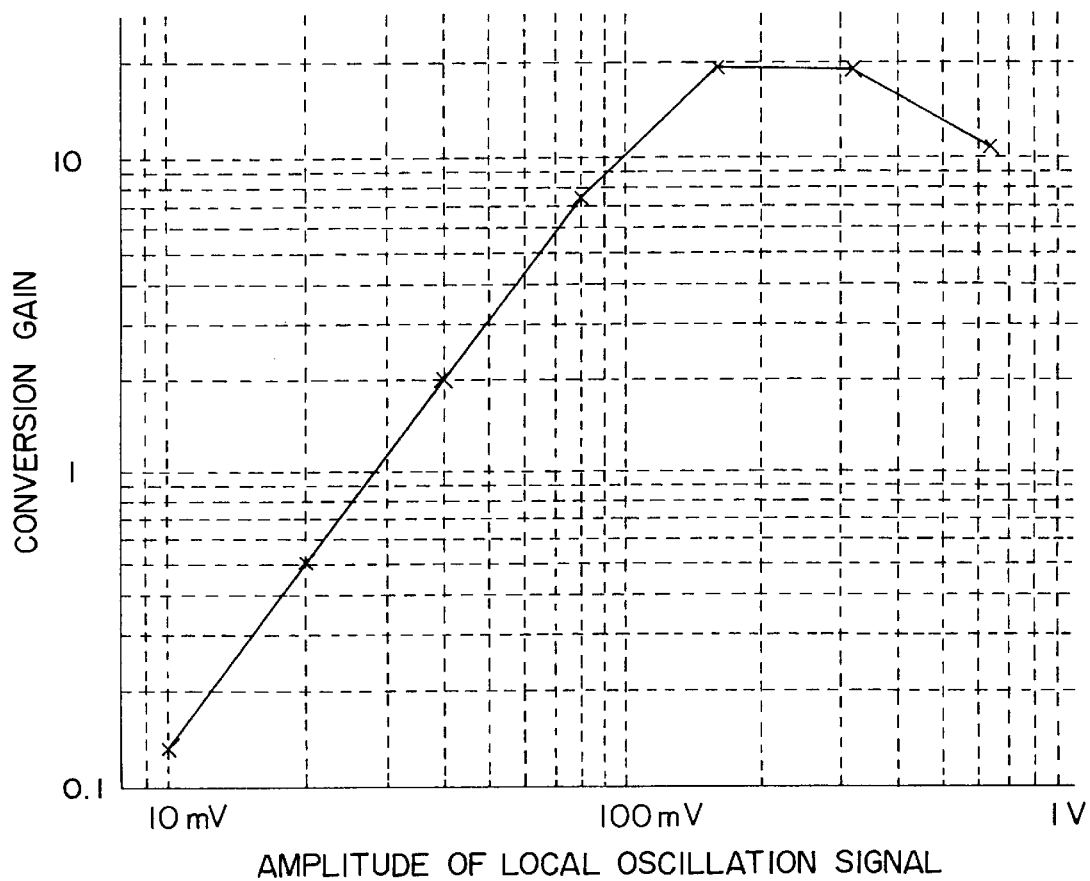
F I G. 14

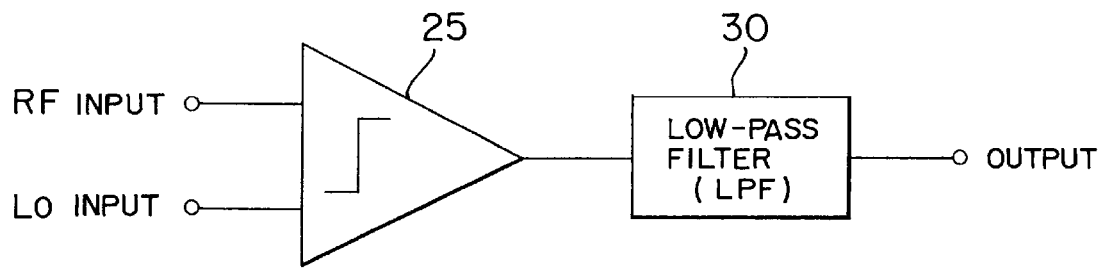
F I G. 17
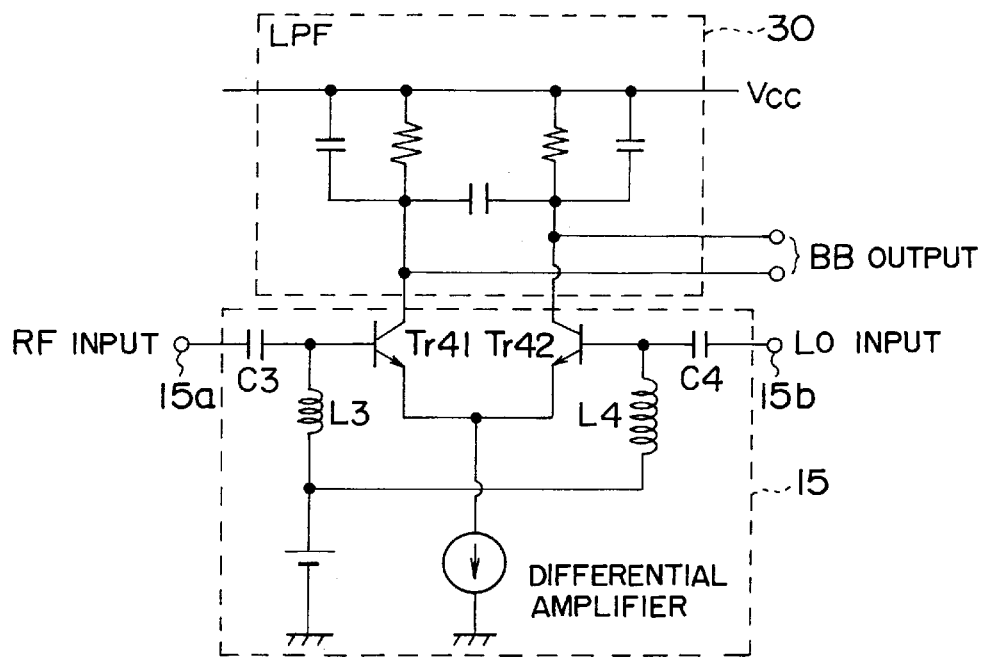
F I G. 18

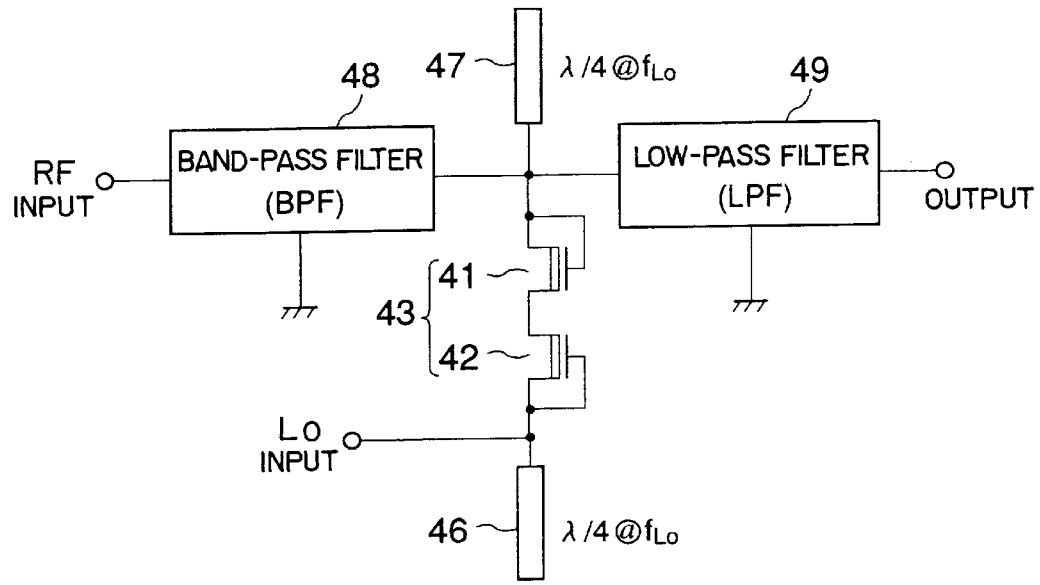
F I G. 23
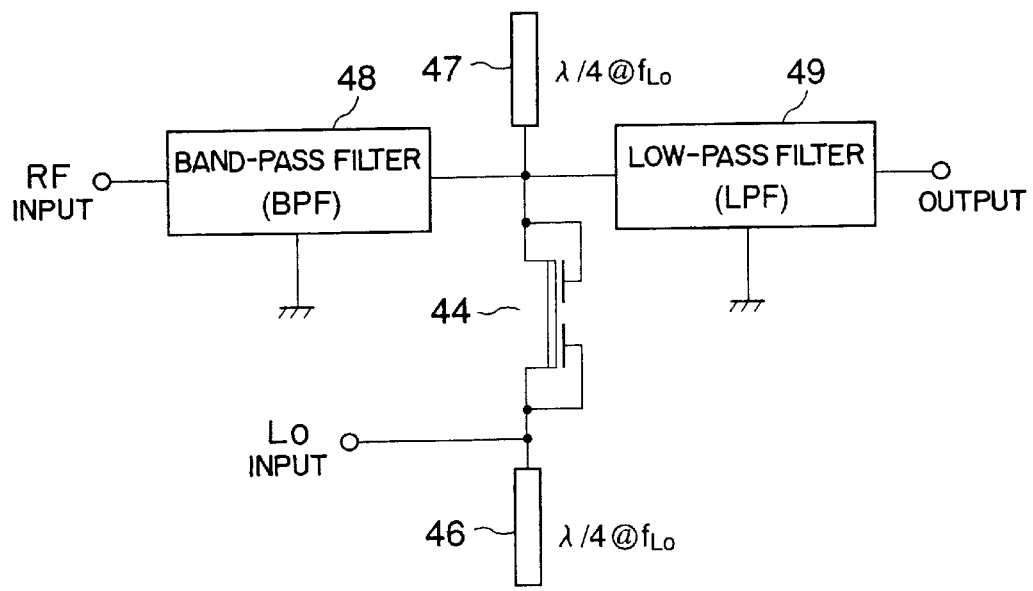
F I G. 24

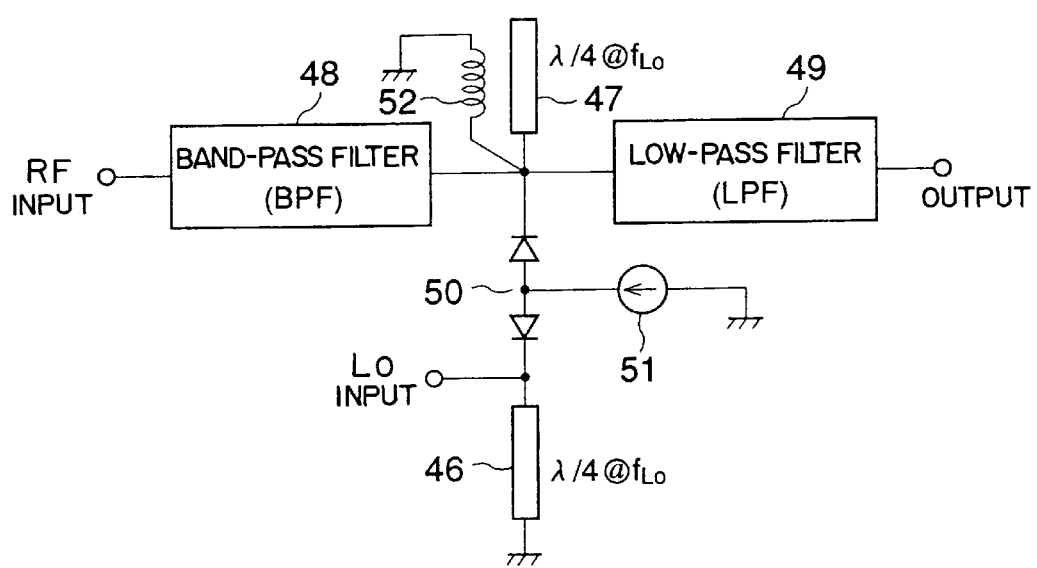
F I G. 25

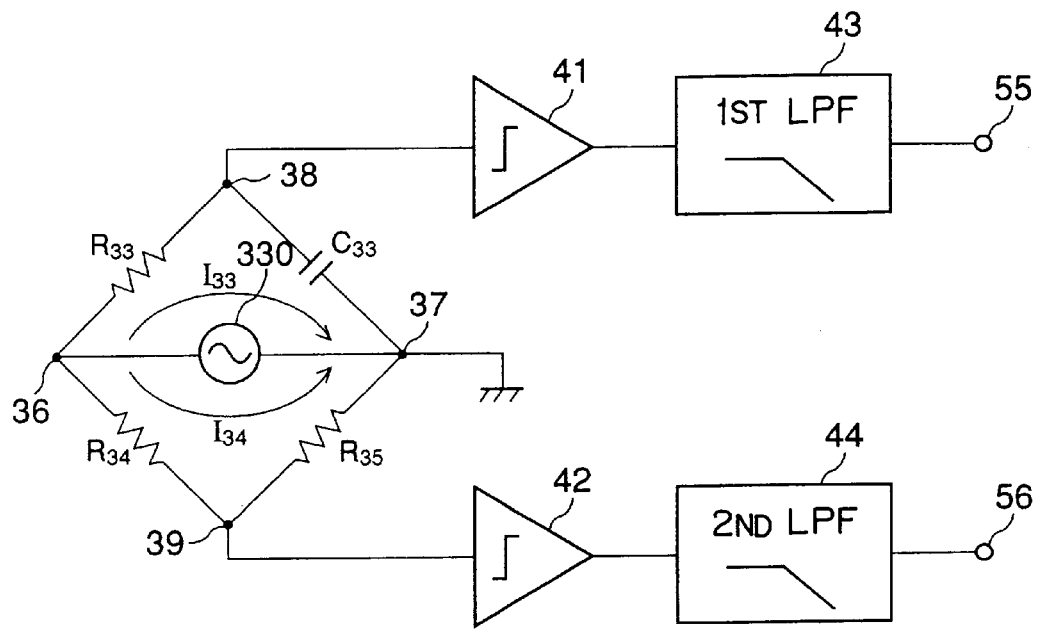
F I G. 34
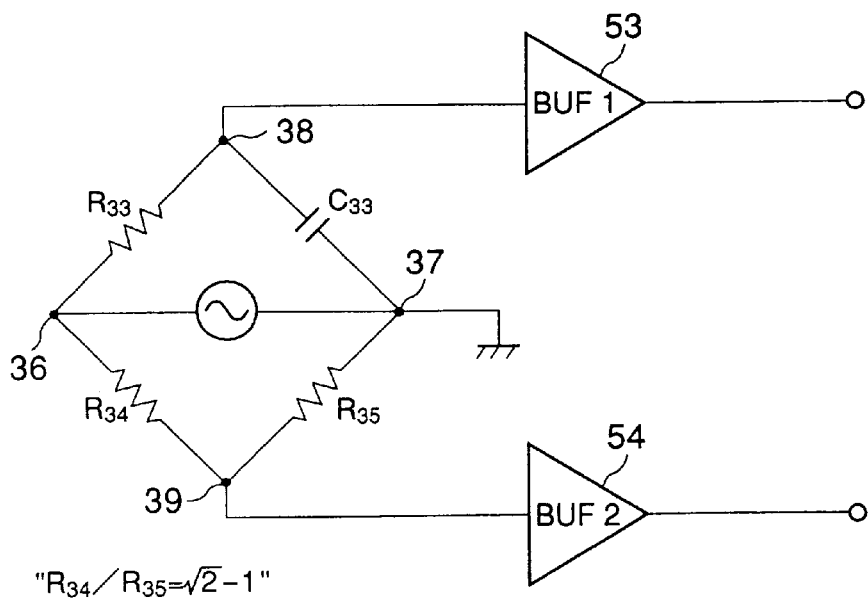
"$R_{34}/R_{35}=\sqrt{2}-1$"
F I G. 35

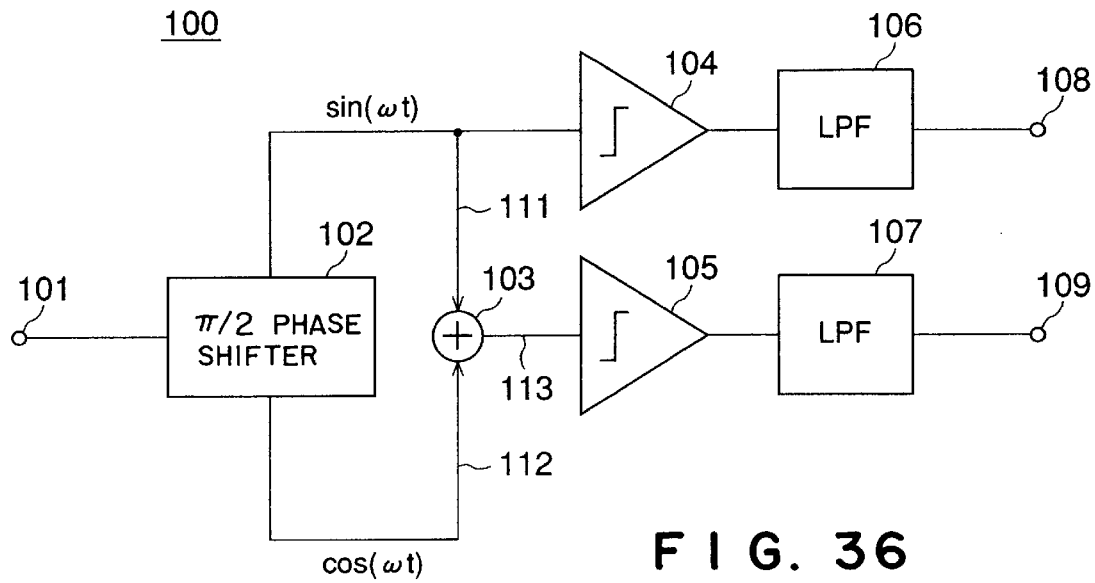
F I G. 36
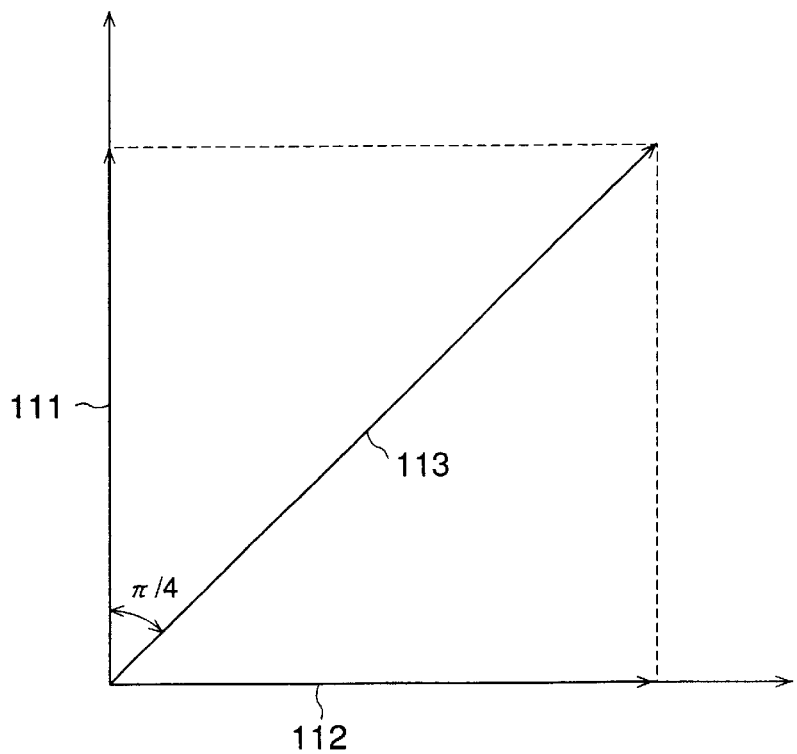
F I G. 37

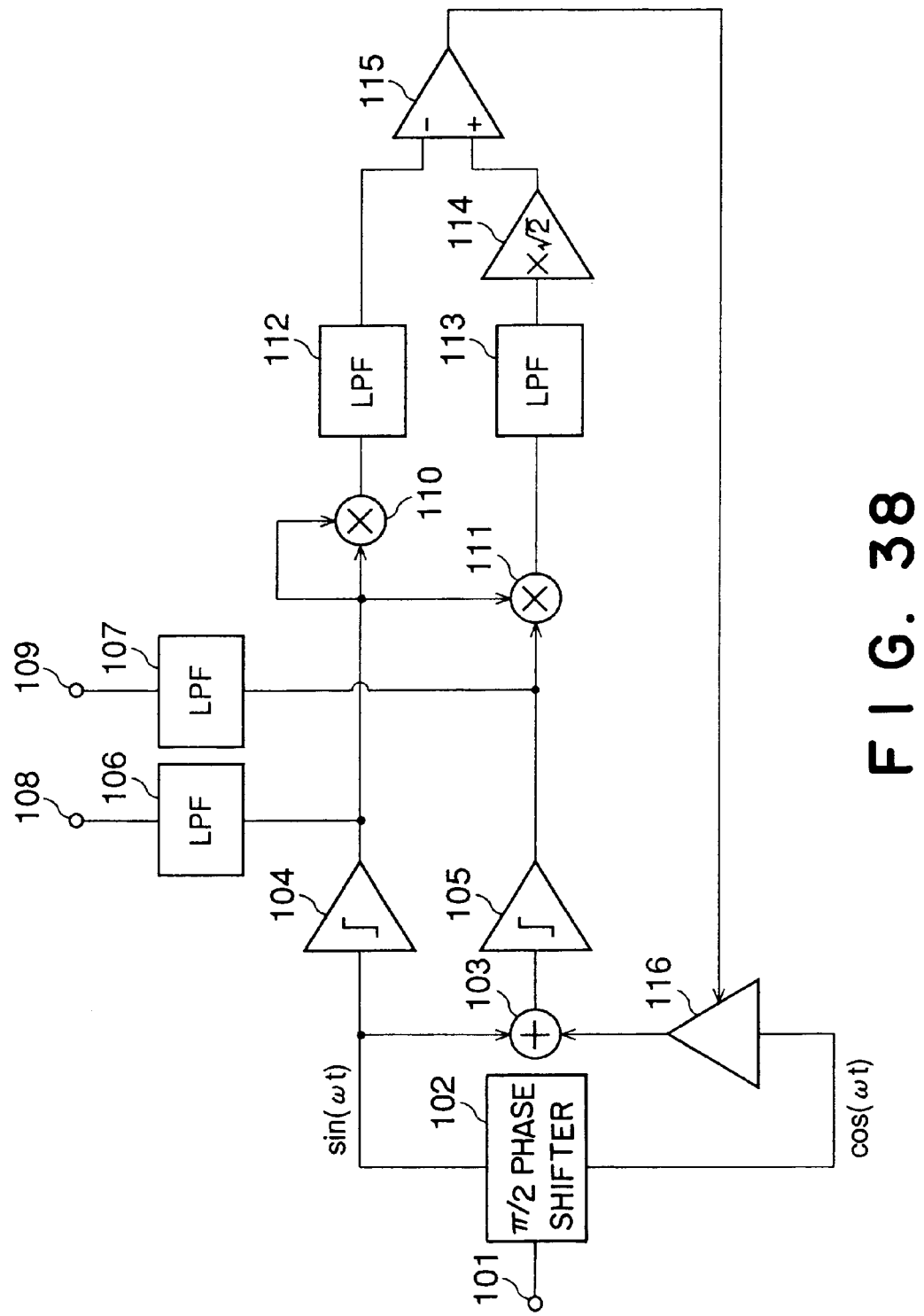
F I G. 38

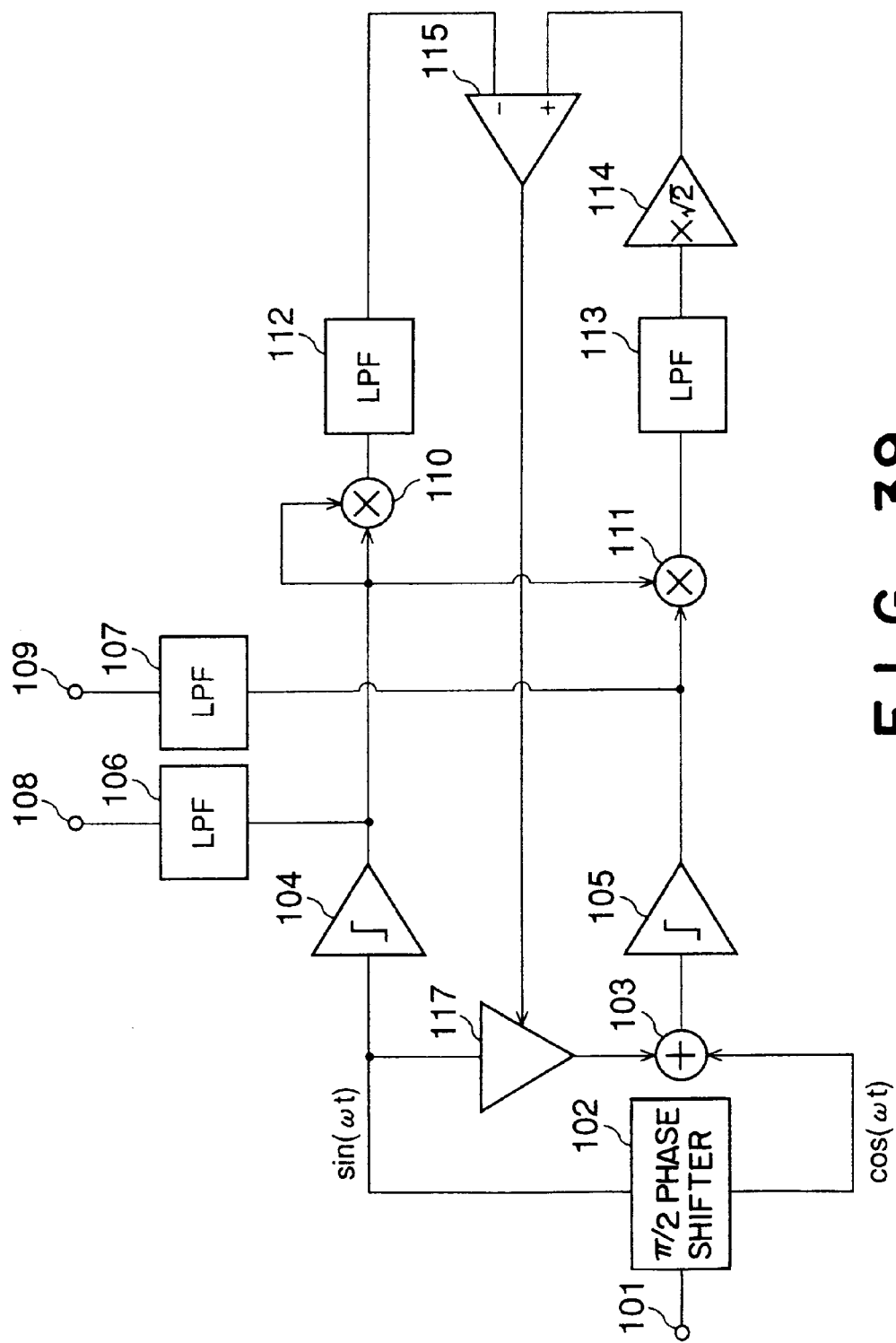
F I G. 39

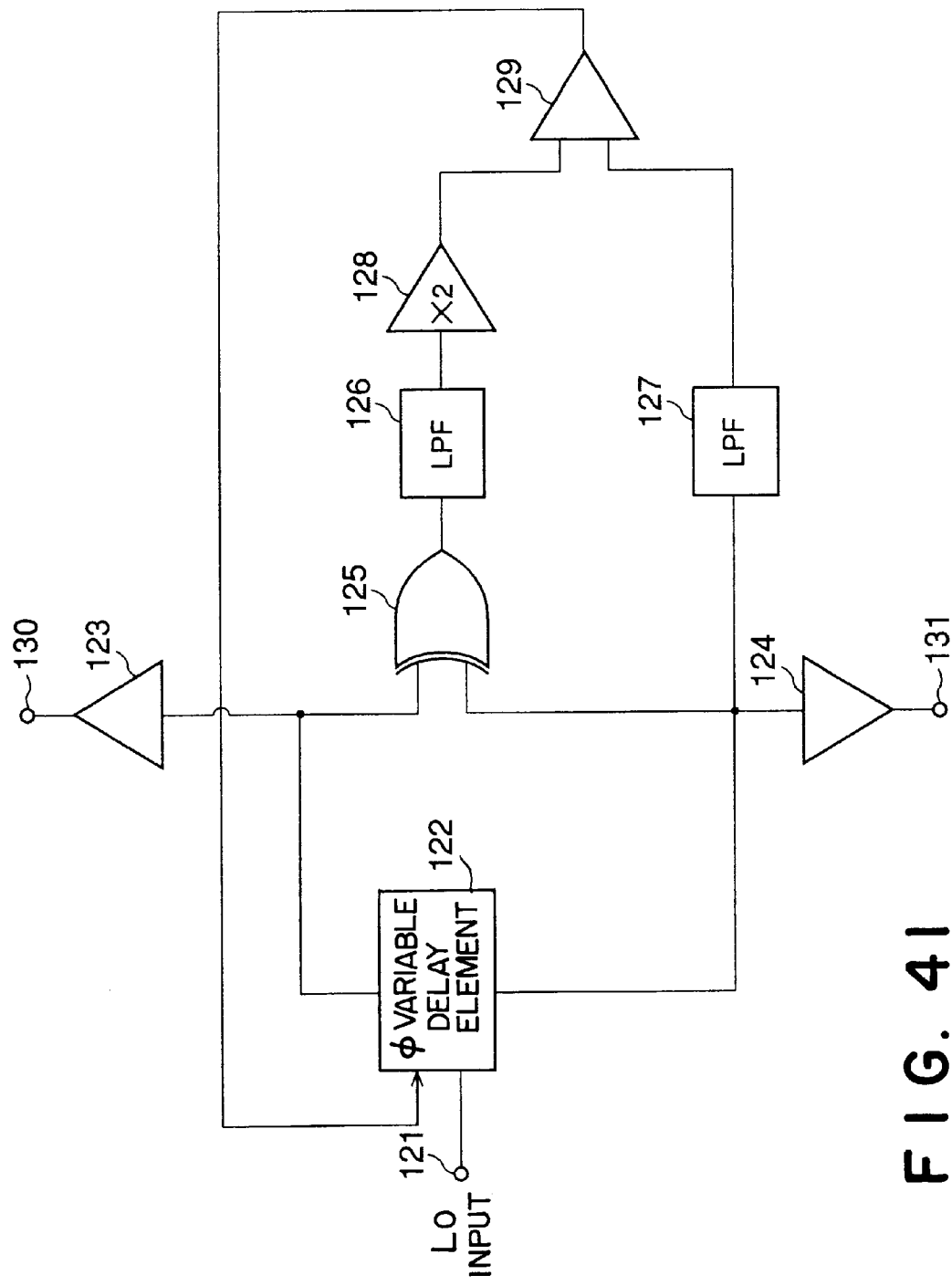
F I G. 41

FREQUENCY CONVERTER AND RADIO RECEIVER USING SAME

BACKGROUND OF THE INVENTION

The present invention relates to a frequency converter for use in a radio communication, and a radio receiver using same. More specifically, the invention relates to a frequency converter which can be driven by a small local oscillation signal, and a radio receiver which can prevent the self-mixing in a direct-conversion receiver and so forth by means of the frequency converter.

An example of conventional frequency converters is illustrated in FIG. 1. A signal inputted from a radio-frequency (RF) terminal 1 is inputted to a base of a first transistor Tr1 via a high-frequency input circuit (not shown). Local oscillation signals inputted from first and second local oscillation (Lo, *Lo) terminals 2 and 3 are also inputted to bases of second and third transistors Tr2 and Tr3 forming a differential pair 4, respectively. Furthermore, the signal *Lo is a inverted signal of the signal Lo. As described in "Analysis and Design of Analog Integrated Circuits" written by P. R.Gray and R. G.Meyer, the differential pair 4 of transistors is operative to distribute the collector current of the first transistor Tr1 to the second and third transistors Tr2 and Tr3 on the basis of the potential difference between the bases of the transistors Tr2 and Tr3. The collector current is converted into a voltage output by means of a load circuit 5 to be outputted as an output Vout. The load circuit 5 comprises fourth and fifth transistors Tr4 and Tr5.

The frequency converter using the differential pair of transistors causes the switching of the first and second transistors Tr2 and Tr3 forming the differential pair by applying great voltage amplitudes to both of the base terminals thereof in order to decrease the fluctuation of conversion gain. In this case, the output can be expressed by the following formula (1).

$$\text{Vout}(t) = K \times F(t) \times \{Irt(t) + Iee\} \quad (1)$$

wherein Irf is a high-frequency signal current outputted from the collector of the transistor Tr1, Iee is a bias current flowing through the collector of the transistor Tr1, F(t) is a function which is alternately 1 and −1 at the same frequency as that of the local oscillation signal, and K is a constant determined by the load circuit.

F(t) contains frequency components integer times as large as the frequency of the local oscillation signal. A desired signal is the product of a fundamental-wave component $\sin(2\pi ft)$ and Irf wherein f is a local oscillation frequency.

Assuming that "Ifr=A(t) sin(2πfrft)", there can be expressed by the following formula (2).

$$K/2A(t)[\cos\{2\pi(frf-f)t\} - \cos\{2\pi(frf+f)t\}] \quad (2)$$

Using a low-pass filter, the signal having a carrier frequency of frf can be converted into a signal having a carrier frequency of frf−f by taking out a signal component of "A(t) cos{2π(frf−f)t}" in the aforementioned formula.

As described in "Low-Power Radio-Frequency IC's for Portable Communication" written by Asad Abide (Processings of the IEEE, vol. 83, No. 4, April 1995), in a case where such a frequency converter circuit is used for a direct-conversion receiver, the local oscillation signal leaks out of a high-frequency signal input terminal to be reflected due to the impedance mismatch of a low-noise amplifier circuit, an antenna and so forth, to be superposed on the high-frequency input signal Irf to be inputted to the frequency converter. This signal is mixed with the original local oscillation signal to be a DC offset. In addition, if the reflection amount fluctuates in accordance with the environmental fluctuation of the antenna, the signal may be a low-frequency noise due to the fluctuation of the offset.

In the direct-conversion receiver, since a received signal is converted into an approximately direct-current baseband signal, it is impossible to separate a DC offset and/or a low-frequency noise from a desired signal by means of a filter, so that the deterioration of communication quality is caused. This problem is called self-mixing of a local oscillation signal. As means for solving this problem, Ito and Kawakami has proposed the use of an even higher-harmonic using an anti-parallel diode pair, in "Even Order Mixing Products of Even Harmonic Mixer for Direct Converter (1995 General Conference of Institute of Electronics Information and Communication Engineers, Lecture Number C-87).

The voltage-current characteristic of a diode can be expressed by "I=Is{exp(αV)−1}" wherein Is and α are constants determined by the type of element. When the Taylor expansion of "exp(x)" in the aforementioned formula is performed, the following formula is derived.

$$\sum_{n=0}^{\infty} (1/n!)X^n \quad (3)$$

wherein X contains terms of even and odd degrees. In this case, the anti-parallel diode pair comprises a pair of diodes of the same characteristic which are connected to each other in the opposite directions so that the terms of even degrees cancel out. Therefore, the anti-parallel diode pair has an odd functional characteristic as a whole. If the frequency of a local oscillation signal is set to be half of the frequency of a high-frequency signal, a tertiary distortion component, wherein the secondary distortions of the high-frequency signal and the local oscillation signal are mixed with each other, is outputted as a desired baseband signal. On the other hand, although the local oscillation signals reflected in the antenna, the low-noise amplifier circuit and so forth are mixed with the original local oscillation signal, the self-mixing of the local oscillation signal is decreased since only the secondary distortion components (square components) are converted into approximately direct currents.

However, in a case where the anti-parallel diode pair is used, it is required to input a great local oscillation signal in order to decrease the conversion loss. For example, as explained by Takahashi and Kuwatsuru in "An FSK Direct conversion Receiver Improving odd order of intermodulation" (1993 Fall Conference of Institute of Electronics Information and Communication Engineers, Lecture Number B-329), although a frequency converter circuit of a differential amplifier circuit type is operated by inputting a local oscillation signal of 90 dB μV and 90 mvp-p, it is required to input a local oscillation signal of at least 0 dBm and about 630 mvp-p in a case where an anti-parallel diode pair is used, as described in the measured results by Ito et. al.

This describes that an even higher-harmonic mixer based on an anti-parallel diode pair utilizes a conducting state and a non-conducting state of a diode. That is, the frequency conversion is realized by the transitions of the following three states:

(1) a state wherein one of diodes is in a conducting state,
(2) a state wherein both of diodes are in a non-conducting state, and (3) a state wherein the other diode is in a conducting state.

Thus, it is expected that if a great signal amplitude is outputted as a local oscillation signal, a receiver produces a great, undesired radiation, so that it is apprehended that the great, undesired radiation obstructs other radio communications. In addition, although it is desired to decrease the consumed power in order to drive a portable telephone and/or a portable radio terminal using cells, it is required to increase the consumed current of a local oscillator or a local oscillation signal amplifier circuit in order to obtain a signal of greater than 0.6 V at a high frequency.

SUMMARY OF THE INVENTION

It is therefore an object of the present invention to provide a frequency converter which can prevent the problems of self-mixing in a direct-conversion receiver and which can be driven by a small local oscillation signal, and a radio receiver using the same.

In order to accomplish the aforementioned and other objects, according to one aspect of the present invention, a frequency converter comprises: a signal synthesizer circuit for inputting a high-frequency signal (a first input signal) and a local oscillation signal (a second input signal) to output a synthesized signal of both signals; an amplitude limitation amplifier circuit for amplifying the output signal of the signal synthesizer circuit to output a signal of a constant amplitude; and a filter for inputting the output signal of the amplitude limitation amplifier circuit to suppress an undesired signal component to output a desired signal component.

With the aforementioned construction, the amplitude limitation amplifier circuit serves as an anti-parallel diode pair in a conventional even higher-harmonic mixer. That is, it is designed that the frequency conversion is realized by the transitions of the following three states:

(1) a state wherein an input signal exceeds a positive limitation amplitude, (2) a state wherein the input signal is between a negative limitation amplitude and the positive limitation amplitude, and (3) a state wherein the input signal exceeds the negative limitation amplitude.

In response to such states, in order to enable a frequency converter to be operated by a small amplitude of a local oscillation signal, the distance between the positive limitation and negative limitation may be set to be narrow. The limit thereof is the case of an ideal amplitude limitation circuit which does not have the aforementioned state (2).

In a case where such an ideal amplitude limitation circuit is used, if a signal having a frequency even times as large as the frequency of a second input signal (a local oscillation signal) is inputted as a first input signal (a high-frequency signal or a modulating signal), the amplitude information of the first input signal is outputted as a pulse-width modulation (PWM) signal.

On the other hand, if a signal having a frequency odd times as large as the frequency of a second input signal (a local oscillation signal) is inputted as a first input signal, the amplitude information of the first input signal is outputted as a pulse-position modulation (PPM) signal. As is well known, although a low-pass filter demodulates a PWM signal, it never demodulates a PPM signal.

Although there is slightly the aforementioned state (2) in a practical amplitude limitation amplifier circuit, it is possible to obtain a signal output which can be substantially regarded as a PWM signal or a PPM signal. Therefore, according to a frequency converter of the present invention, it is possible to form a frequency converter for even higher-harmonics, which can be operated by a local oscillation signal of a small amplitude.

Since it is possible to suppress the DC offset due to the reflection of a local oscillation signal, or the occurrence of a low-frequency noise due to the fluctuations of the reflection amount, it is possible to form a receiver which can receive a weak high-frequency input signal of a good quality, and to decrease the amplitude of the local oscillation signal in comparison with that in an anti-parallel diode, so that it is possible to decrease undesired radiation.

In addition, if the ratio of the amplitude of a high-frequency signal to the amplitude of a local oscillation signal is the same, the position of a zero cross-point is also the same. If the position of a zero cross-point is the same, the amplitude of a demodulating signal of the PWM. Therefore, the conversion gain is in inverse proportion to the amplitude of the local oscillation signal. By controlling the amplitude oscillation signal using this characteristic, the conversion gain can be controlled. In this method, there is the following advantages. In the case of the method for controlling the amplitude of a received signal by means of a variable attenuator or a variable-gain amplifier circuit, it is impossible to separate a noise component, which has the same frequency as that of a desired signal produced by the variable attenuator or the variable gain amplifier circuit, by means of a filter or the like. On the other hand, in a case where the amplitude of the local oscillation signal is controlled, the noise produced by the variable attenuator or the variable-gain amplifier circuit is superposed on the local oscillation signal. The noise component having a frequency approximate to the local oscillation frequency does not appear in the output of the frequency converter for the same reason why the self-mixing has a small influence thereon. Since noise components having frequencies even times as large as the frequency of the local oscillation signal appear in the output of the frequency converter, if these noises are removed, it is possible to prevent the increase of the noise produced by the variable attenuator or the variable-gain amplifier circuit.

In addition, if a direct-conversion type receiver is combined with a direct-modulation type transmitter as a radio communication terminal, it is possible to decrease the number of parts and the size of the communication terminal. However, since the frequency of a transmitted signal is the same as the frequency of the local oscillation signal, the oscillation frequency may be unstable due to the mixing of the transmitted signal in the local oscillator. In order to prevent this, the local oscillator may be covered by a metal plate and so forth. Alternatively, the influence of the transmitted signal may be prevented by decreasing the local oscillation frequency to half of the transmission frequency to obtain a desired frequency using a frequency doubler circuit. If a frequency converter of the present invention is combined with a transmitter of such a system, it is not required to newly provide a local oscillator. Moreover, if a frequency converter of the present invention is used as a modulator, any frequency doubler circuits are not required, so that it is possible to further decrease the size of the communication terminal.

As mentioned above, according to the present invention, it is possible to eliminate the problems of self-mixing, and it is also possible to form a frequency converter of a small leakage of local oscillation signals. In addition, an orthogonal modulator using a frequency converter, according to the present invention, has an advantageous effect in which the deterioration of noise characteristic due to signal distribution. Moreover, a radio receiver using a frequency converter, according to the present invention, can prevent the increase of noise by a circuit provided for adjusting gains, so that it is possible to provide a receiver having a small noise.

BRIEF DESCRIPTION OF THE DRAWINGS

In the drawings:

FIG. 2 is a block diagram of the first preferred embodiment of a frequency converter according to the present invention;

FIG. 10 is a view illustrating the output waveforms of the respective sections of the triangular-wave generator circuit of FIG. 3;

FIG. 13 is a circuit diagram of an amplitude limitation amplifier circuit in the frequency converter of FIG. 12;

FIG. 14 is a graph showing the relationship between the amplitude of a local oscillation signal and a conversion gain when a differential amplifier circuit is used as an amplitude limitation amplifier circuit in the frequency converter in the third preferred embodiment;

FIG. 17 is a block diagram of the fifth preferred embodiment of a frequency converter according to the present invention;

FIG. 18 is a circuit diagram of the sixth preferred embodiment of a frequency converter according to the present invention;

FIG. 23 is a block diagram of the tenth preferred embodiment of a frequency converter according to the present invention;

FIG. 24 is a block diagram illustrating a modified embodiment of the frequency converter in the tenth preferred embodiment;

FIG. 25 is a block diagram of the eleventh preferred embodiment of a frequency converter according to the present invention;

FIG. 34 is a block diagram of the eighteenth preferred embodiment of a phase shifter according to the present invention;

FIG. 35 is a block diagram of the nineteenth preferred embodiment of a phase shifter according to the present invention;

FIG. 36 is a block diagram of the twentieth preferred embodiment of a phase shifter according to the present invention;

FIG. 37 is a characteristic view explaining the operation of the phase shifter of FIG. 36;

FIG. 38 is a block diagram of the twenty-first preferred embodiment of a phase shifter according to the present invention;

FIG. 39 is a block diagram of the twenty-second preferred embodiment of a phase shifter according to the present invention;

FIG. 41 is a block diagram of the twenty-fourth preferred embodiment of a phase shifter according to the present invention;

DESCRIPTION OF THE PREFERRED EMBODIMENT

Figure 1:
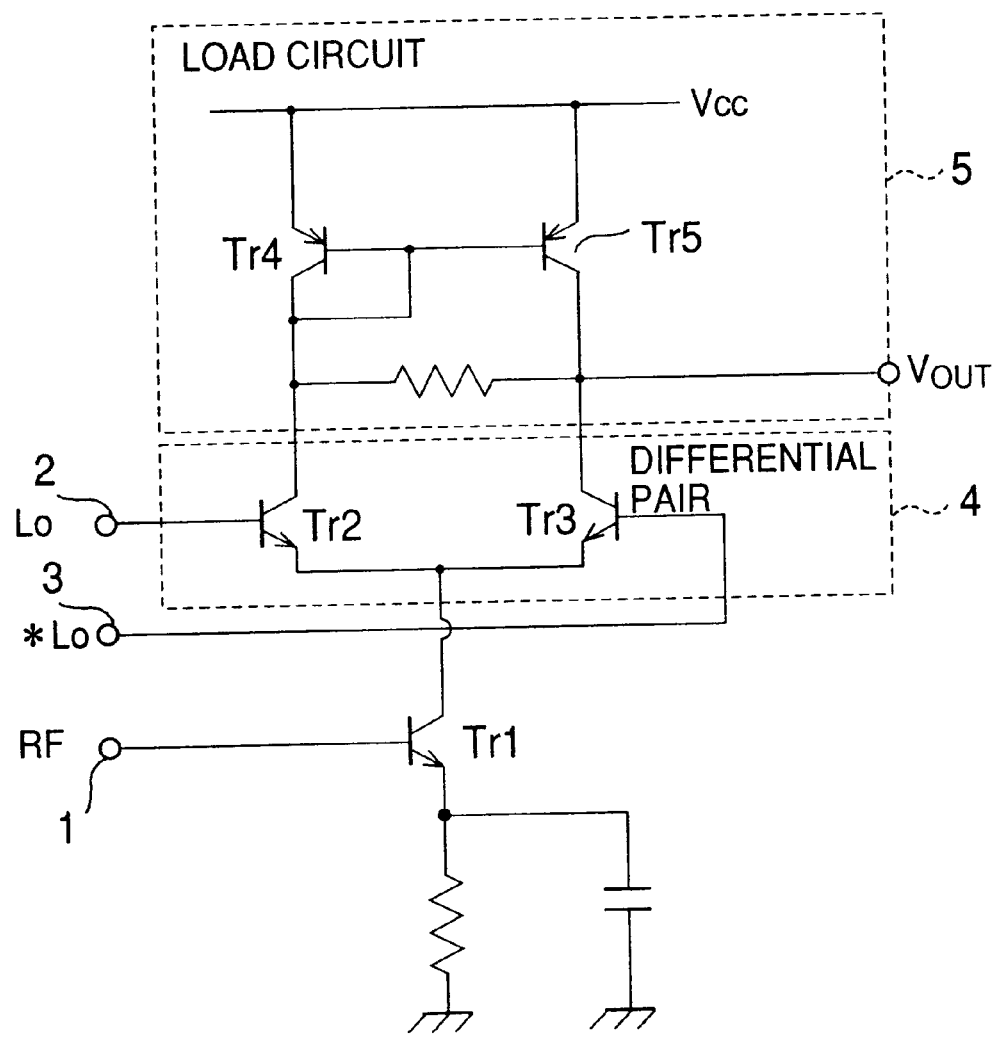
FIG. 1 is a circuit diagram illustrating an example of a conventional frequency converter.

Referring now to the accompanying drawings, the preferred embodiments of a frequency converter and a radio receiver, according to the present invention, will be described below in detail.

FIG. 2 is a block diagram of the first preferred embodiment of a frequency converter according to the present invention. In FIG. 2, the first preferred embodiment of a frequency converter, according to the present invention, comprises: signal synthesizer means 10 for synthesizing a high-frequency input signal inputted from a first terminal 1, with a local oscillation signal inputted from a second terminal 2, to output a synthesized signal; amplitude limitation means 20 for inputting the synthesized signal to limiting the amplitude thereof to output a signal; and filter means (a low-pass filter) 30 for demodulating an output signal of the amplitude limitation means 20 by allowing low-frequency components of a signal, which has been PWM-modulated by the high-frequency input signal and amplitude-limited by the amplitude limitation means 20, to pass therethrough. The signal output demodulated by the filter means 30 is outputted as a baseband signal to the outside through an output terminal 6.

Figure 2A:
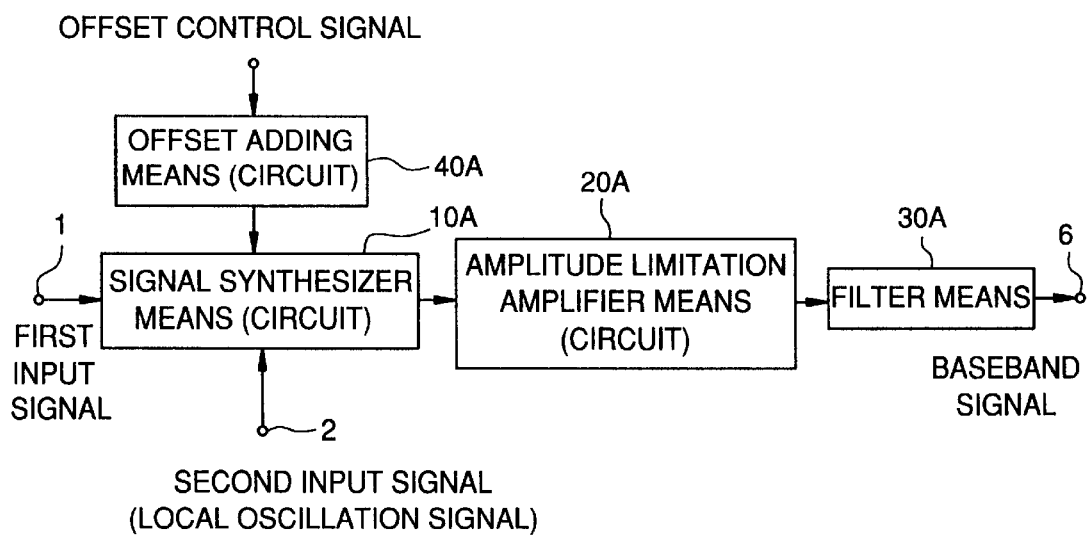
FIG. 2A is a block diagram showing the modified example of the first preferred embodiment according to the present invention.

FIG. 2A shows the construction of the frequency converter according to a modified example of the first embodiment. The frequency converter according to the first embodiment may have signal synthesizer means (circuit) 10A, offset adding means (circuit) 40A for adding a DC offset to the synthesized signal outputted from the signal synthesizer means 10A, amplitude limitation amplifier means (circuit) 20A, and filter means 30A.

The signal synthesizer circuit 10A has transistors Tr6 through Tr9 to input a first input signal through a terminal 1 and a second input signal, such as a local oscillation signal, through a terminal 2 so as to synthesize the first and second input signals to output a synthesized signal. The amplitude limitation amplifier circuit 20A has transistors Tr24 and Tr25 to amplify the synthesized signal, to which the DC offset is added so as to output an amplified signal having a constant amplitude. The filter means 30A inputs the amplified signal outputted from the amplitude limitation circuit 20A, to remove an unnecessary signal component contained in the amplified signal so as to output a baseband signal including a desired signal component through an output terminal 6.

Figure 2B:
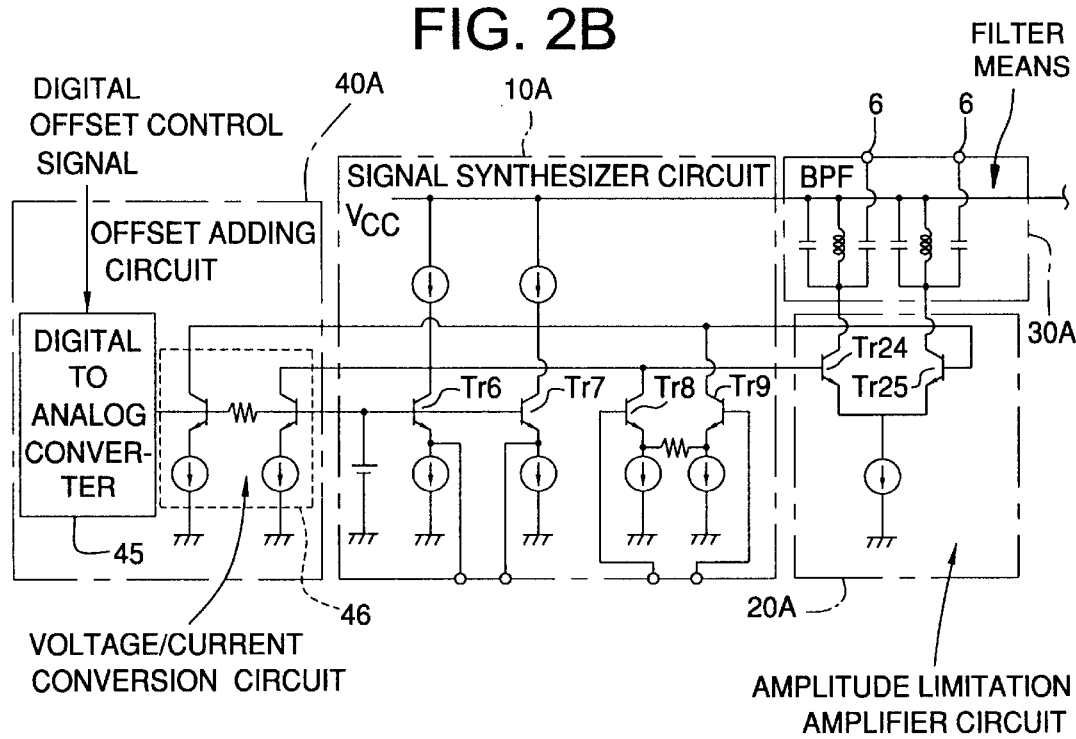
FIG. 2B is a circuit diagram showing the detailed example of the frequency converter shown in FIG. 2A.

The offset adding circuit 40A shown in FIG. 2A may comprise a digital-to-analog converter 45, together with a voltage/current conversion circuit 46 having transistors and current sources, as shown in FIG. 2B, if the offset control signal is a digital offset control signal.

Figure 3:
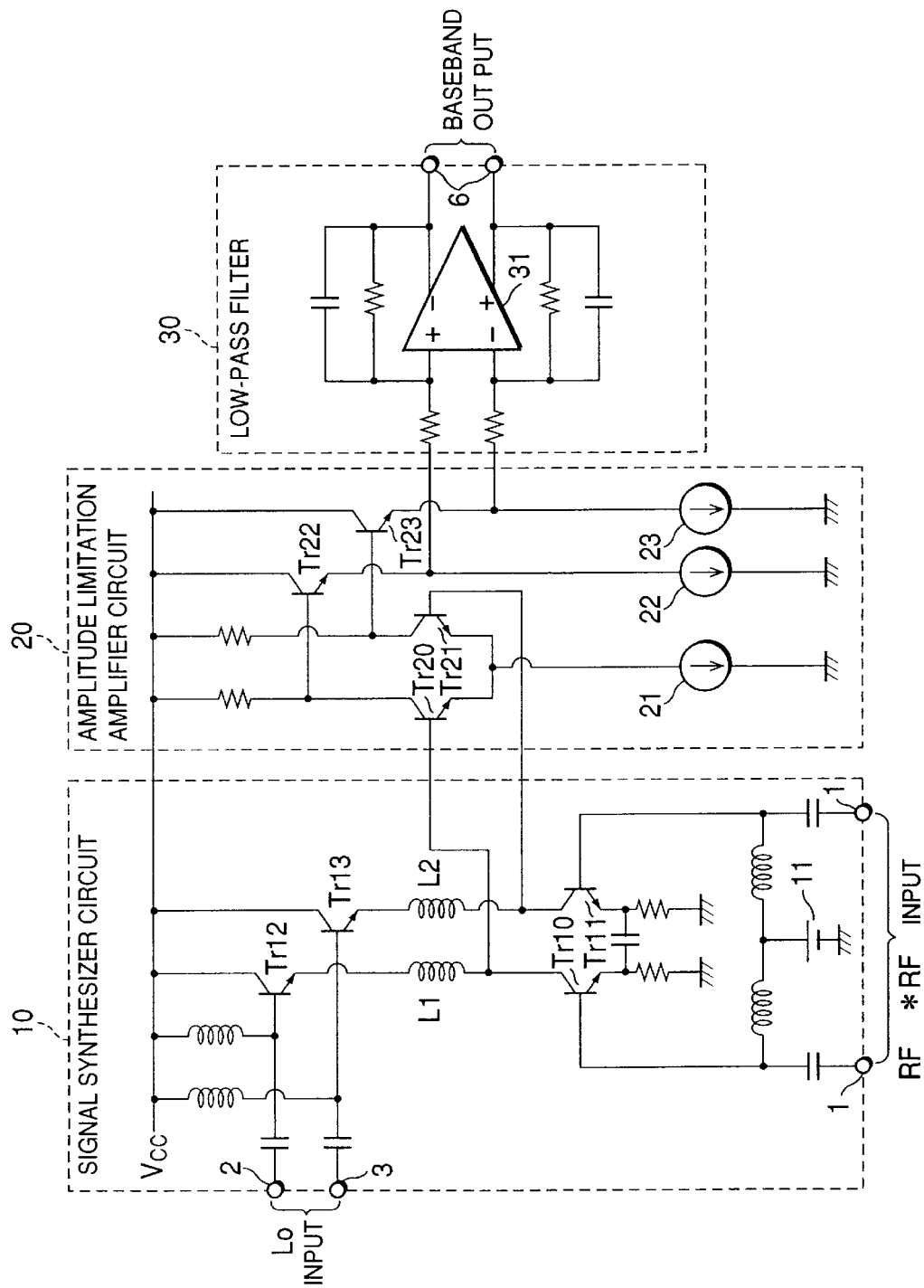
FIG. 3 is a circuit diagram illustrating the detailed construction of the frequency converter of FIG. 2.

FIG. 3 is a circuit diagram illustrating the detailed construction of the first preferred embodiment of a frequency converter according to the present invention. In FIG. 3, the signal synthesizer circuit (means) 10 comprises: transistors Tr10 and Tr11, to the bases of which high-frequency input signals are supplied; and transistors Tr12 and Tr13, to the bases of which first and second local oscillation signals are supplied, and the emitters of which are connected to the collectors of the transistors Tr10 and Tr11, respectively. Furthermore, the reference number 11 is a bias circuit.

The amplitude limitation circuit (means) 20 comprises: a transistor Tr20 for inputting a signal at through the connection point between the emitter and collector of the transistors Tr10 and Tr12, to the base thereof; a transistor Tr21 for inputting a signal at the connection point between the collector and emitter of the transistors Tr11 and Tr13, to the base thereof; a transistor Tr23, the base of which is connected to the collector of the transistor Tr21; a constant-current source 21 connected to the emitters of the transistors Tr20 and Tr21; a constant-current source 22 connected to the emitter of the transistor Tr22; and a constant-current source 23 connected to the emitter of the transistor Tr23.

The low-pass filter serving as the filter means has a differential operational amplifier 31 for inputting a voltage at the connection point between the transistor Tr22 and the constant-current source 22, to the positive terminal thereof through a resistor, and for inputting a voltage at the connection point between the transistor Tr23 and the constant-current source 23, to the negative terminal thereof through a resistor.

With this construction, a high-frequency (RF) signal and an inverted high-frequency (*RF) signal thereof are supplied through terminals 1 to the bases of two transistors Tr10 and Tr11, which are operated as a differential amplifier, respectively. The transistors Tr10 and Tr11 has inductors L1 and L2 serving as loads thereof, respectively.

On the other hand, local oscillation (Lo) signals are inputted to the bases of the transistors Tr12 and Tr13 through the terminals 2 and 3, respectively. Since these transistors Tr12 and Tr13 serve as emitter followers, the emitters thereof are connected to the collectors of the transistors Tr10 and Tr11 serving as loads thereof via inductors L1 and L2 to be connected to the ground, and since the impedances of the collectors of the transistors Tr10 and Tr11 are high, the Lo signal is supplied to the bases of the transistors Tr20 and Tr21. In addition, high-frequency signal currents inputted by the inductances L1 and L2 serving as loads are also supplied to the bases of the transistors Tr20 and Tr21 of the amplitude limitation amplifier circuit 20.

Referring to characteristic views of FIGS. 4 and 5, the basic principle of the frequency converter according to the present invention, which has the aforementioned construction and operation, will be described below.

First, in a case where the frequency of the local oscillation signal is half of the frequency of the high-frequency signal, the operating principle will be described. The signal synthesized by the signal synthesizer circuit is inputted to the amplitude limitation amplifier circuit. The amplitude limitation amplifier circuit having an ideal characteristic outputs a binary output signal in accordance with the sign (positive or negative sign) of the input signal. In FIG. 4, the graph of the local oscillation signal is expressed by a solid line, and the graph obtained by multiplying the high-frequency signal by −1 is expressed by a dotted line. The synthesized signal is zero at the intersection points of the solid line and the dotted line (expressed by □ in FIG. 4). In FIG. 4, the period of time (expressed by ←→ in FIG. 4) in which the input of the amplitude limitation amplifier circuit is positive is shorter than the period of time in which the input is negative. As the amplitude of the high-frequency signal input decreases, the period of time in which the input is positive and the period of time in which the input is negative approach 50%, respectively.

Figure 4:
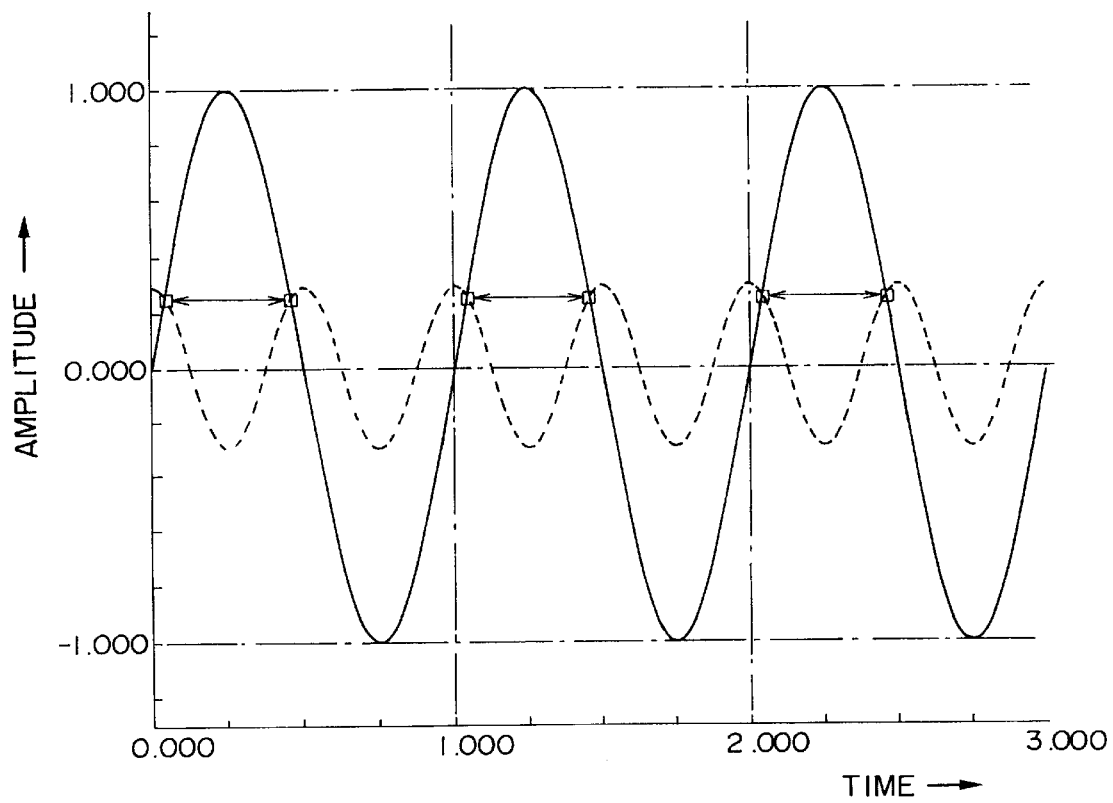
FIG. 4 is a graph explaining that an even-time signal is converted into a PWM modulating signal.
Figure 5:
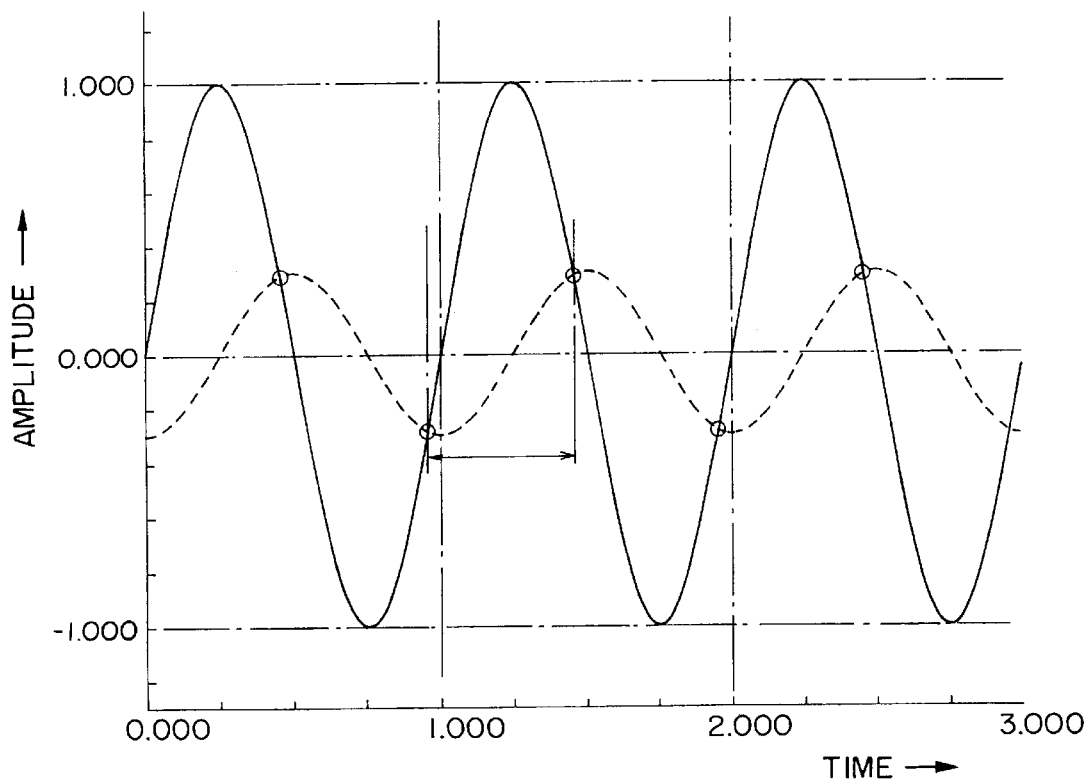
FIG. 5 is a graph explaining that an odd-time signal is converted into a PPM modulating signal.

On the other hand, with respect to the high-frequency input signal of an anti-phase of the signal shown in FIG. 4, the period of time in which the input is positive is longer than the period of time in which the input is negative. FIG. 4 shows a phase relationship in which the high-frequency input signal is maximum or minimum at the same time that the local oscillation signal is zero. However, when the phase of the high-frequency input signal is shifted by $\pi/2$, the high-frequency input signal is zero at the same time that the local oscillation signal is zero. Therefore, the period of time in which the input of the amplitude limitation amplifier circuit is positive and the period of time in which the input is negative are 50%, respectively, independently of the amplitude. That is, the output of the amplitude limitation amplifier circuit is pulse-width modulated (PWM) by the amplitude and phase of the high-frequency signal. Since the PWM signal is demodulated by the low-pass filter, it is possible to take out a baseband signal.

On the other hand, the first preferred embodiment of the frequency converter shown in FIG. 3, when a local oscillation signal reflects on a high-frequency amplifier or an antenna, the zero cross-point (defined by the sign ○) is moved substantially in parallel, so that there is the pulse-position modulation, not the pulse-width modulation. Since the pulse-position modulation is not demodulated by a low-pass filter, the reflected wave has substantially no influence upon the baseband output.

This is not limited to a frequency two times as large as or equal to the local oscillation signal. The frequency even times including zero as large as the local oscillation signal appears at the output by the pulse-width modulation. However, since the odd-times frequency propagates as the pulse-position demodulated, it is never modulated by the low-pass filter.

As described in FIG. 4, an even higher-harmonic frequency converter according to the present invention is designed to recover the baseband signal by means of the LPF after it is converted into the PWM signal. At this time, since the pulse-width modulation (PWM) uses a direct-current region in which the building up and the lagging edge of the local oscillation signal (Lo) are approximately constant, when the building up and the lagging edge are constant, for example, like a triangular wave, i.e. when the straight-line region is sufficiently ensured, the efficiency thereof is best. An embodied circuit for producing a triangular wave from the standpoint of efficiency will be described in detail using FIGS. 6 and 10.

Figure 6:
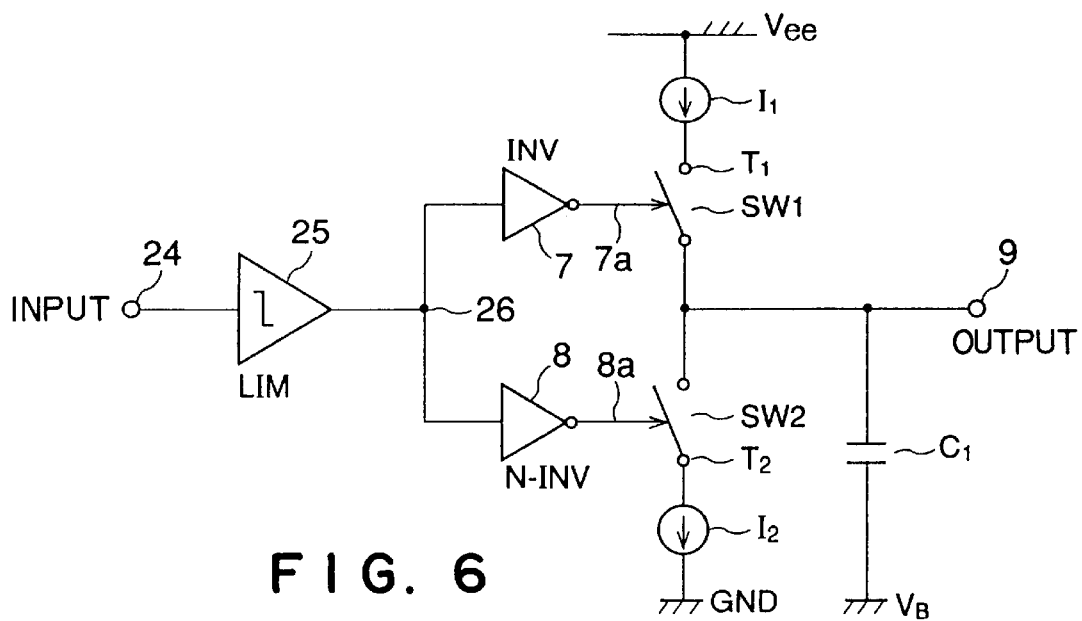
FIG. 6 is a block diagram of a first embodiment of a triangular-wave generator circuit of the frequency converter according to the present invention.

FIG. 6 is a circuit diagram illustrating a first embodiment of the triangular-wave generator circuit. In this figure, an input terminal 24 serves as an input terminal for a local oscillation signal of an amplitude limitation circuit (LIM) 25. An output terminal 26 of the amplitude limitation circuit 25 serves as input terminals of an inverter (INV) 7 and a buffer (N-INV) 8, output terminals of which are defined by reference numbers 7a and 8a. A terminal T1 of a first switch SW1 is connected to a voltage source VCC via a current source I1, and a terminal 9 serves as an output terminal of a triangular-wave generator circuit. The output terminal 7a of the inverter 7 serves as a signal input terminal for controlling the conducting and blocking of the first switch SW1. When the signal level is H, the first switch SW1 is in the conducting state. Similarly, the output terminal 8a of the buffer 8 serves as a control terminal of a second switch SW2, and a terminal 9 is an output terminal. The terminal T2 of the second switch SW2 is connected to the ground via a current source I2 which is the same as the current source I1 to produce current I. In addition, a charging capacitor C1 is connected between the terminal 9 and a power supply VB.

Figure 7:
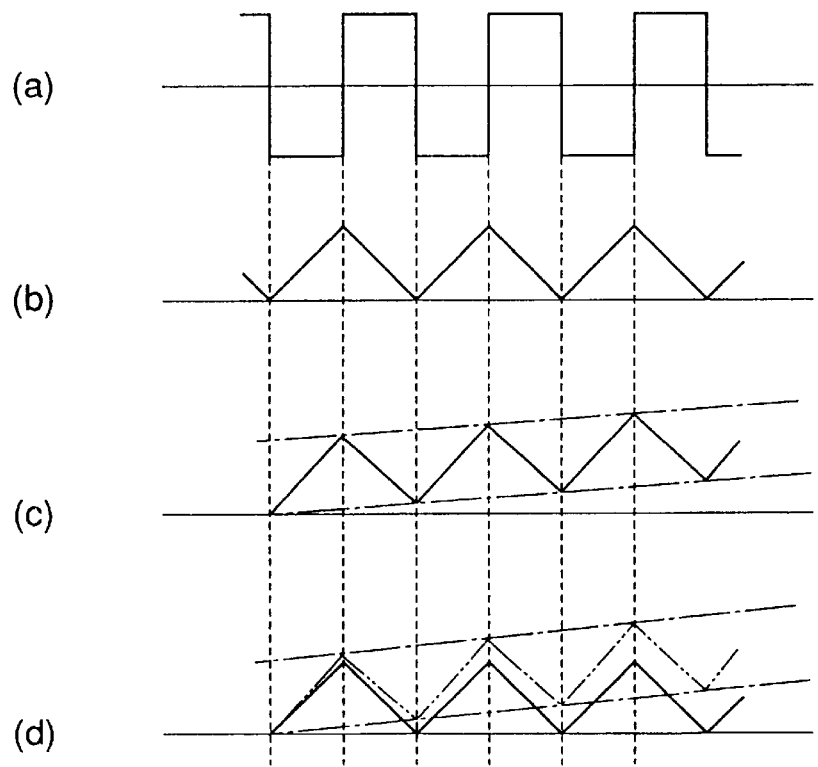
FIG. 7 is a view illustrating the waveform characteristics of the triangular-wave generator circuit of FIG. 6.

Referring to FIG. 7, the operation of the first embodiment of the triangular-wave generator circuit will be described below.

A local oscillation signal is inputted to the input terminal 24 for the local oscillation signal, and a rectangular wave as shown in FIG. 7(a) is outputted to the terminal 26 by means of the amplitude limitation circuit 25. A waveform having a reversed phase of the waveform of the terminal 26 is obtained at the terminal 7a by means of the inverter 7, and an output having the same phase as that of the terminal 26 is obtained at the terminal 8a by means of the buffer 8. When the signal levels of the terminals 7a and 8a are H, the first and second switches SW1 and SW2 are in the conducting states, so that the current sources I1 and I2 are alternately charged in the capacitor C1. Therefore, a triangular wave as shown in FIG. 7(b) can be obtained.

However, even if the circuit is designed so that the currents of the current sources I1 and I2 are equal to each other, when the current of the current source I2 is less than the current of the current source I1 due to the dispersion in the manufacture or the like, the output potential of the output terminal 9 is gradually increased as shown in FIG. 7(c), so that the malfunction of the downstream circuit occurs. Similarly, when the current of the current source I1 is less than the current of the current source I2, the output potential of the output terminal 9 is gradually decreased, so that the malfunction of the circuit at the next stage occurs.

Figure 8:
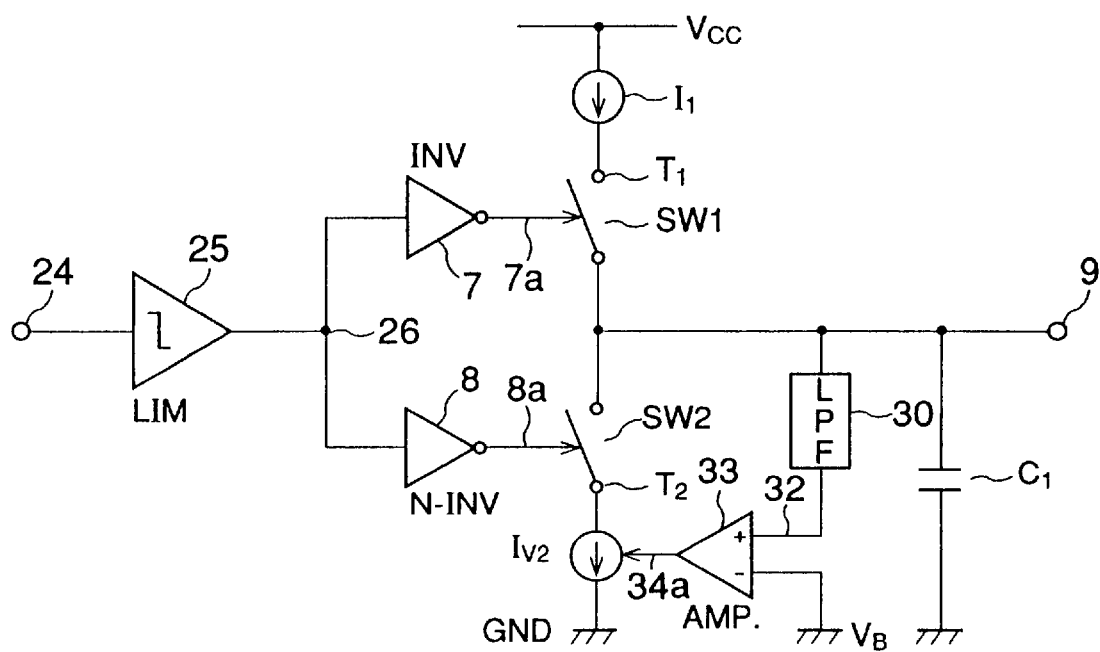
FIG. 8 is a block diagram of a second embodiment of a triangular-wave generator circuit of the frequency converter according to the present invention.

Referring to FIG. 8, a second embodiment of a triangular-wave generator circuit according to the present invention, which can eliminate the aforementioned problems, will be described below. Since the basic construction is the same as that of the first embodiment of the triangular-wave generator circuit, only different portions will be described.

In FIG. 8, a signal flowing through an output terminal 9 is supplied to a positive (+) terminal 32 of a linear amplifier 33 via a low-pass filter (LPF) 30. A negative (−) terminal of the linear amplifier 33 is connected to a power supply VB, and an output terminal 34a of the amplifier 33 serves as a control terminal of a variable current source IV2. An output of the variable current source IV2 is connected to a terminal T2 of a second switch SW2, and another output terminal is connected to the ground level GND. Furthermore, it is assumed that the current in the variable current source IV2 varies linearly by the DC potential of the terminal 32.

The operation of the second preferred embodiment of the triangular-wave generator circuit shown in FIG. 8 will be described below.

For example, in a case where the current of the current source I1 is greater than the current of the variable current source IV2, the potential of the output terminal 9 is gradually increased so as to form a waveform as shown in FIG. 7(c). Therefore, since the low-pass filter 30 allows only a signal component of a low-frequency region of a signal, which is the same as the signal appearing at the output terminal 9, to pass therethrough so as to supply this signal component to the input terminal of the linear amplifier 33, the potential of the terminal 32 is increased during one cycle of the local oscillation signal in comparison with the potential of the power supply VB by a value which is obtained by multiplying an error value between the current source I1 and the variable current source IV2 by the one cycle of the local oscillation signal to divide the multiplied result by the capacitance of the capacitor C1. The linear amplifier 33 produces a signal proportional to the difference between the signal of the terminal 32 and the potential of the power supply VB, to control the variable current source IV2 through the control terminal 34. In the case of this embodiment, since the potential of the variable current source IV2 increases, the output current of the variable current source increases, so that it is controlled so as to be the same current as that of the current source I1. This state is shown in FIG. 7(d). As shown in FIG. 7(d), with respect to the ascending triangular wave expressed by the two-dot chain line, the corrected current as expressed by the solid line is outputted.

Figure 9:
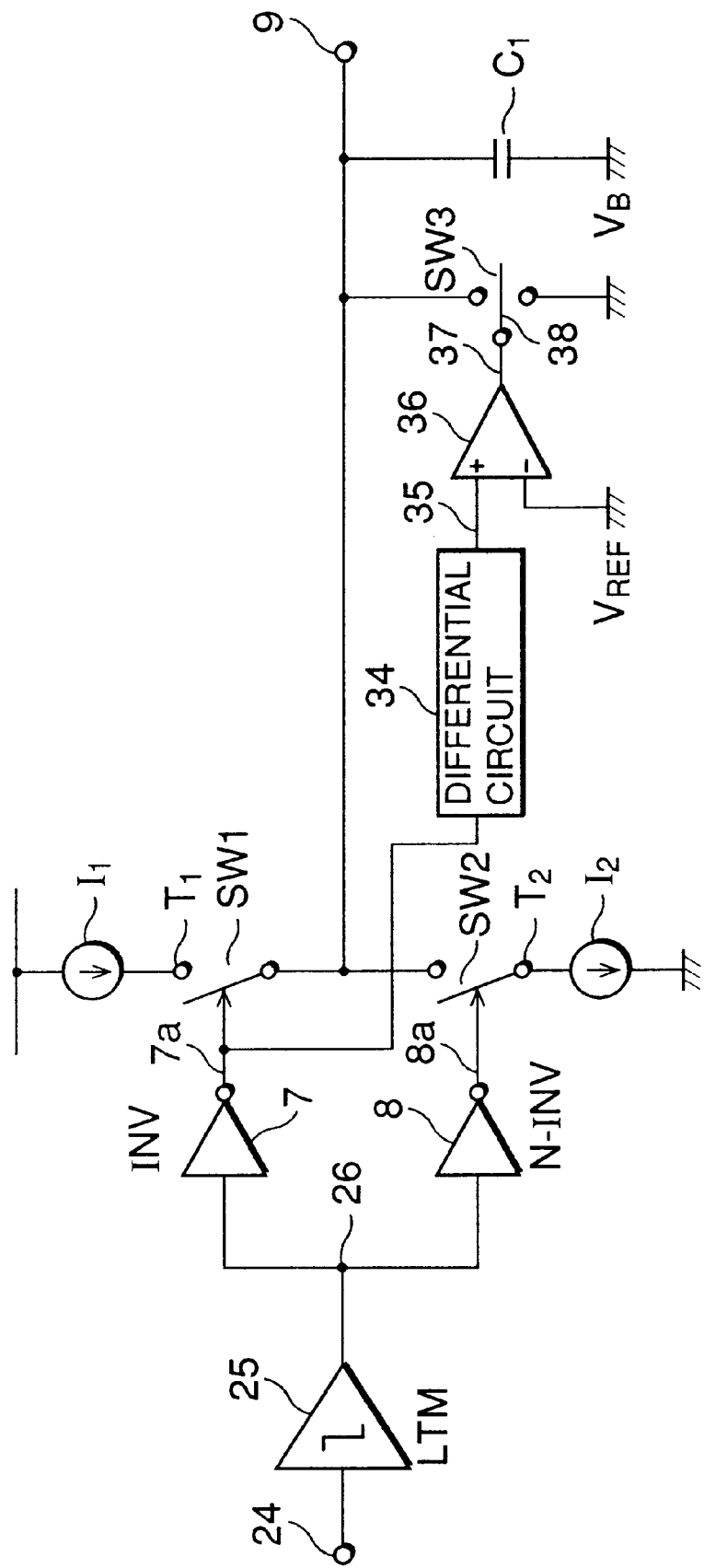
FIG. 9 is a block diagram of a third embodiment of a triangular-wave generator circuit of the frequency converter according to the present invention.

Referring to FIGS. 9 and 10, the third embodiment of a triangular-wave generator circuit, according to the present invention, will be described in detail below.

FIG. 9 illustrates the construction of the third embodiment of a triangular-wave generator circuit according to the present invention, wherein corresponding or similar elements in FIGS. 6 and 8 are identified by the same reference numbers so as to omit the repeated descriptions. In this figure, a signal appearing at an output terminal 7a of an inverter 7 is used as a control signal of a first switch SW1, and it is also supplied to a differential circuit 34. The output signal of the differential circuit 34 is supplied to a positive (+) terminal of a comparator 36 via an output terminal 35, and a desired reference potential VREF from a power supply is supplied to a negative (−) terminal of the comparator 36. The output of the comparator 36 controls the operation of a third switch SW3, and a traveling contact (a controlled terminal) 38 of the third switch SW3 is connected to a terminal 9 and a power supply VB.

Referring to the characteristic view of FIG. 10, the operation of the triangular-wave generator circuit shown in FIG. 9 will be described below.

The signal waveform appearing at an output terminal 26 of a limiter 25 is a rectangular wave as shown in FIG. 10(a). When an inverted signal of this signal waveform is supplied to the differentiating circuit 34 to be differentiated, the differentiated output appears as a waveform as shown in FIG. 10(b). The comparator 36 outputs a waveform of the output terminal of the differential circuit 34 as shown in FIG. 10(b), and a waveform of a terminal 37 as shown in FIG. 10(c) by comparing with the reference potential VREF. Therefore, in the third embodiment of the triangular-wave generator circuit, a pulse is produced at the same time that the output waveform of the limiter 25 shown in FIG. 10(a) falls, and this falling pulse forces a capacitor C1 to be discharged. Thus, even if first and second current sources I1 and I2 are not matched with each other (FIG. 10(c)), the forced reset is performed, so that the terminal 9 can obtain an output having substantially the same waveform (FIG. 10(d)) as the desired triangular wave (FIG. 7(b)).

Figure 11:
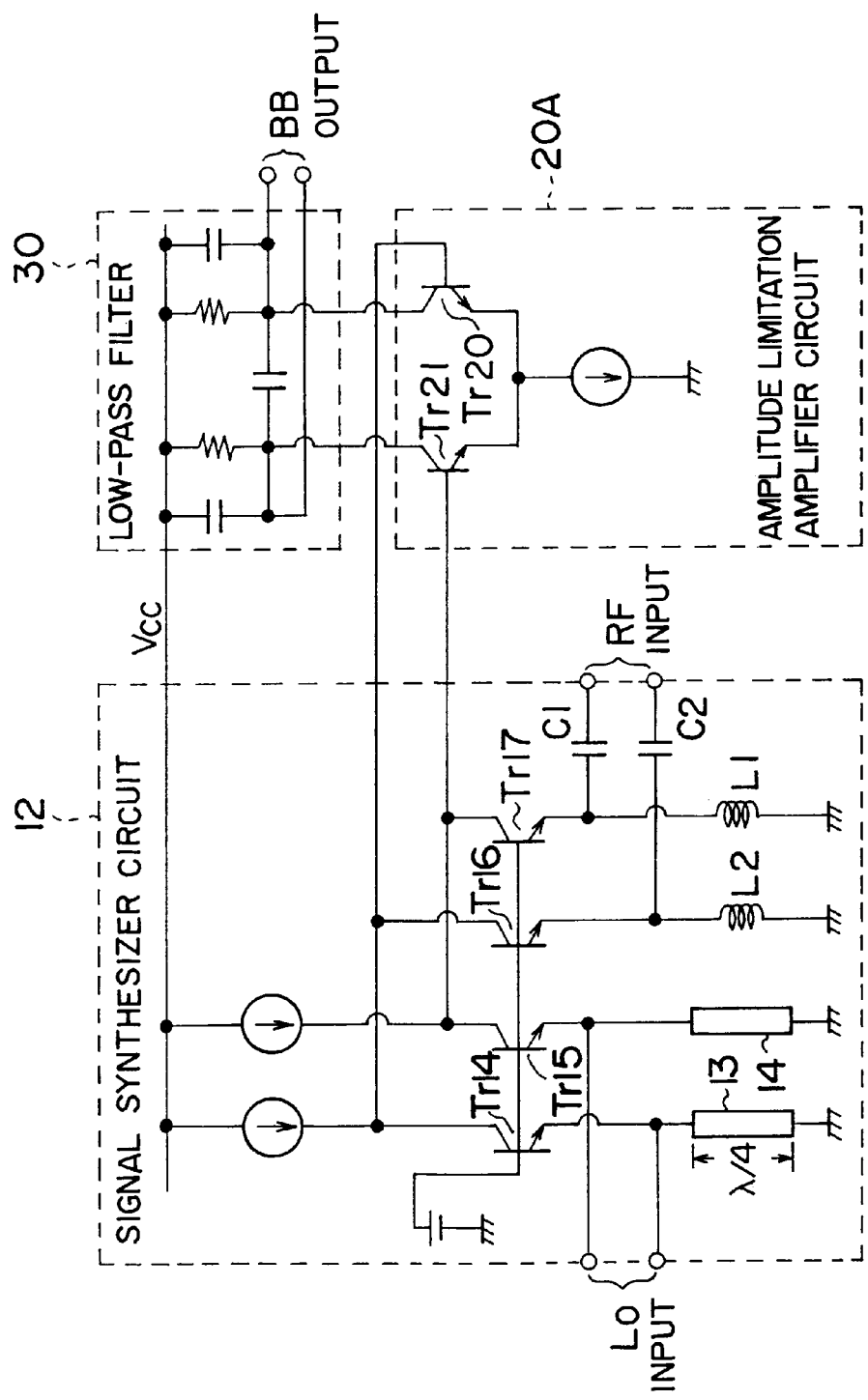
FIG. 11 is a circuit diagram of the second preferred embodiment of a frequency converter according to the present invention.

FIG. 11 is a circuit diagram of the second preferred embodiment of a frequency converter, according to the present invention, which is different from the circuit shown in FIG. 3. In this preferred embodiment, in order to remove noises even times as large as the local oscillation signal, short stubs 13 and 14 having a wavelength of a fourth of that of a local oscillation signal are used in a signal synthesizer circuit 12. Each of the fourth-wavelength short stubs 13 and 14 serves as a short-circuit in the case of a direct current or at a frequency even times as large as the local oscillation frequency, and is open at a frequency as large as the local oscillation frequency. Therefore, noises even times as large as the local oscillation signal are removed, and the local oscillation (Lo) signal inputs are inputted from the emitter terminals of grounded-base transistors Tr14 and Tr15. The high-frequency (RF) signal inputs are inputted from grounded-base transistors Tr16 and Tr17. Capacitors C1 and C2 and inductors L1 and L2 form a matching circuit for the RF input in the signal synthesizer circuit 12. In the signal synthesizer circuit (means) 12, since noises even times as large as the local oscillation signal are suppressed, the noise characteristic can be improved.

Furthermore, an amplitude limitation amplifier circuit 20A comprises a differential amplifier including a pair of transistors Tr24 and Tr25, and the collector output of the differential amplifier is supplied to a low-pass filter 30. The low-pass filter 30 comprises: two resistors which are connected to the collectors of transistors Tr20 and Tr21 forming the differential amplifier of the amplitude limitation amplifier 20A, and to the voltage source Vcc; two capacitors connected in parallel to the resistors; and a capacitor connected between two connection points of the resistors and the collectors of the transistors Tr20 and Tr21.

With this construction, local oscillation signals of two phases, i.e. positive and negative phases, are supplied to the emitters of the grounded-base transistors Tr14 and Tr15, and high-frequency signals of two phases, i.e. positive and negative phases, are supplied to the transistors Tr16 and Tr17. Two λ/4 transmission lines 13 and 14 are connected between the emitters of the transistors Tr14 and Tr15 and the ground. These λ/4 transmission lines 13 and 14 can short-circuit and remove undesired wave components mixed with two local oscillation signals. The local oscillation signal wherein the undesired wave component is removed by the λ/4 transmission line 13, and one of the high-frequency signals are inputted to the emitters of the transistors Tr14 and Tr16 to be outputted to the collectors thereof, respectively, so as to be current-added to be supplied to the base of the transistor Tr20. In addition, the local oscillation signal wherein the undesired wave component is removed by the λ/4 transmission line 14, and the other high-frequency signal are inputted to the emitters of the transistors Tr15 and Tr17 to be outputted to the collectors thereof, respectively, so as to be current-added to be supplied to the base of the transistor Tr21. The signal current-added and supplied by the differential amplifier comprising the transistors Tr20 and Tr21 is amplifier while the amplitude thereof is limited.

Figure 12:
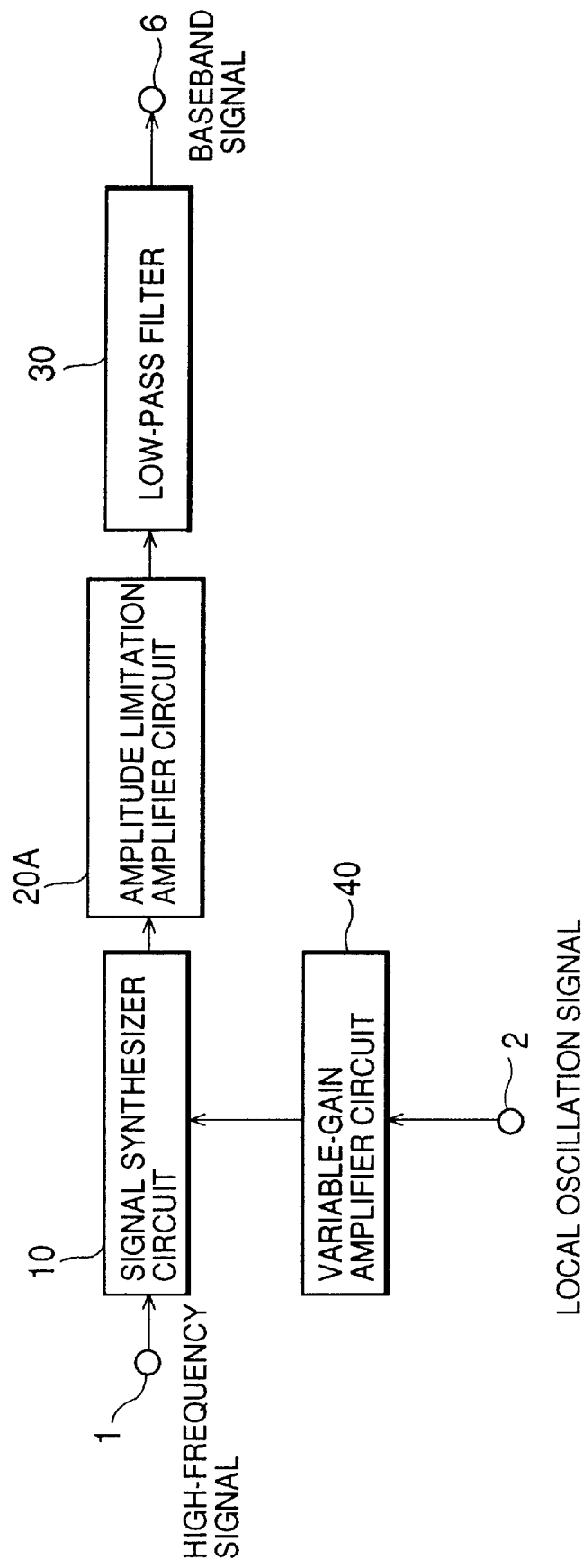
FIG. 12 is a block diagram of the third preferred embodiment of a frequency converter according to the present invention.

FIG. 12 is a block diagram of the third preferred embodiment of a frequency converter according to the present invention. In FIG. 12, a variable-gain amplifier circuit 40 for controlling the amplitude of a local oscillation signal inputted to a signal synthesizer circuit (means) 10 is provided between an input terminal 2 for a local oscillation signal and the signal synthesizer circuit 10. In this preferred embodiment of the frequency converter, in a case where the amplitude of a high-frequency signal inputted to the signal synthesizer circuit 10 via a terminal 1 is great, the amplitude of a local oscillation signal inputted from the terminal 2 is also amplified by the variable-gain amplifier circuit 40 to increase the amplitude, so that it is possible to prevent the amplitude of the output signal from exceeding a certain value.

FIG. 13 illustrates a specific embodiment of the amplitude limitation amplifier circuit 20A in the third preferred embodiment of the frequency converter shown in FIG. 12. As described in the aforementioned literature "Analysis and Design of Analog Integrated Circuits", a differential amplifier circuit is designed to operated as an amplitude limitation amplifier circuit by itself with respect to an input signal of a greater amplitude than a certain value, but it is designed to be operated as a linear amplifier circuit when the input signal is small. The amplitude limitation amplifier circuit 20A includes a differential pair 27 constituted by transistors Tr43 and Tr44, a differential pair 28 constituted by transistors Tr47 and Tr48, and transistors Tr45, Tr46, Tr49 and Tr50 respectively operating as buffer circuits. For that reason, as shown in FIG. 14, the conversion gain of a frequency converter using a differential amplifier circuit is maximum near a local oscillation signal amplitude of 200 mV. Therefore, in order to operate the differential amplifier circuit as an amplitude limitation amplifier circuit with respect to smaller signal inputs, the amplitude limitation amplifier circuit 20A shown in FIG. 13 uses two stages of differential amplifiers so as to decrease the local oscillation signal when the high-frequency signal input is small.

In this case, the upstream differential amplifier 24 is operated as a substantially linear amplifier circuit, and the downstream differential amplifier 25 mainly serves as an amplitude limitation amplifier circuit. When the high-frequency input signal is great, the amplitude of the input signal supplied from the signal synthesizer circuit 10 is limited mainly by the upstream differential amplifier 24, and the downstream differential amplifier 25 functions as a buffer amplifier for a PWM signal wherein the pulse width is modulated. Therefore, it is possible to increase the variable range of gain using a multi-stage amplitude limitation amplifier circuit 20A.

While the operation of a down-converter for outputting a signal of a lower frequency than that of an input signal has been described above, a low-frequency signal may be inputted to modulate a local oscillation signal by the PWM to obtain a modulated signal even times as large as the local oscillation signal. In this case, a band-pass filter having a passing band of an even frequency of a desired signal is used.

Figure 15:
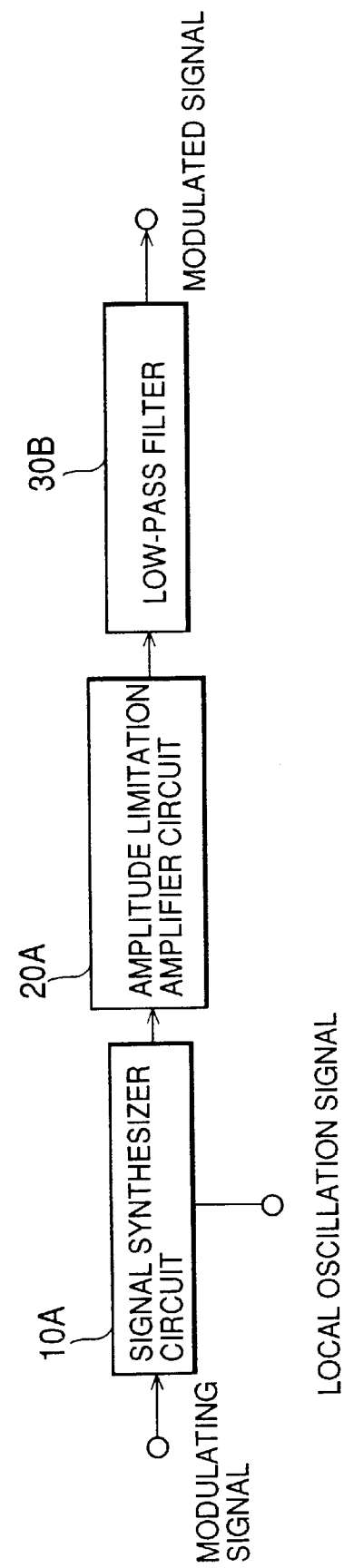
FIG. 15 is a block diagram of the fourth preferred embodiment of a frequency converter according to the present invention.

FIG. 15 is a block diagram of the fourth preferred embodiment of a frequency converter according to the present invention. In the fourth preferred embodiment of the frequency converter, a modulating signal and a local oscillation signal are inputted to a signal synthesizer circuit (means) 10A to form a synthesized signal. This synthesized signal is inputted to an amplitude limitation amplifier circuit 20A wherein the amplitude of the synthesized signal is limited. The output of the amplitude limitation amplifier circuit 20A is PWM-modulated by the modulating signal. In the PWM modulating signal, since the amplitude of a frequency component even times as large as the frequency of a local oscillation signal is in proportion to the amplitude of the modulating signal, it is possible to obtain a modulated signal by taking out the frequency component by means of a band-pass filter 30A. Therefore, this preferred embodiment is an example of a frequency converter circuit used as a modulator. Alternatively, it may be used as an up-converter for inputting an intermediate frequency in place of the modulating signal.

Figure 16:
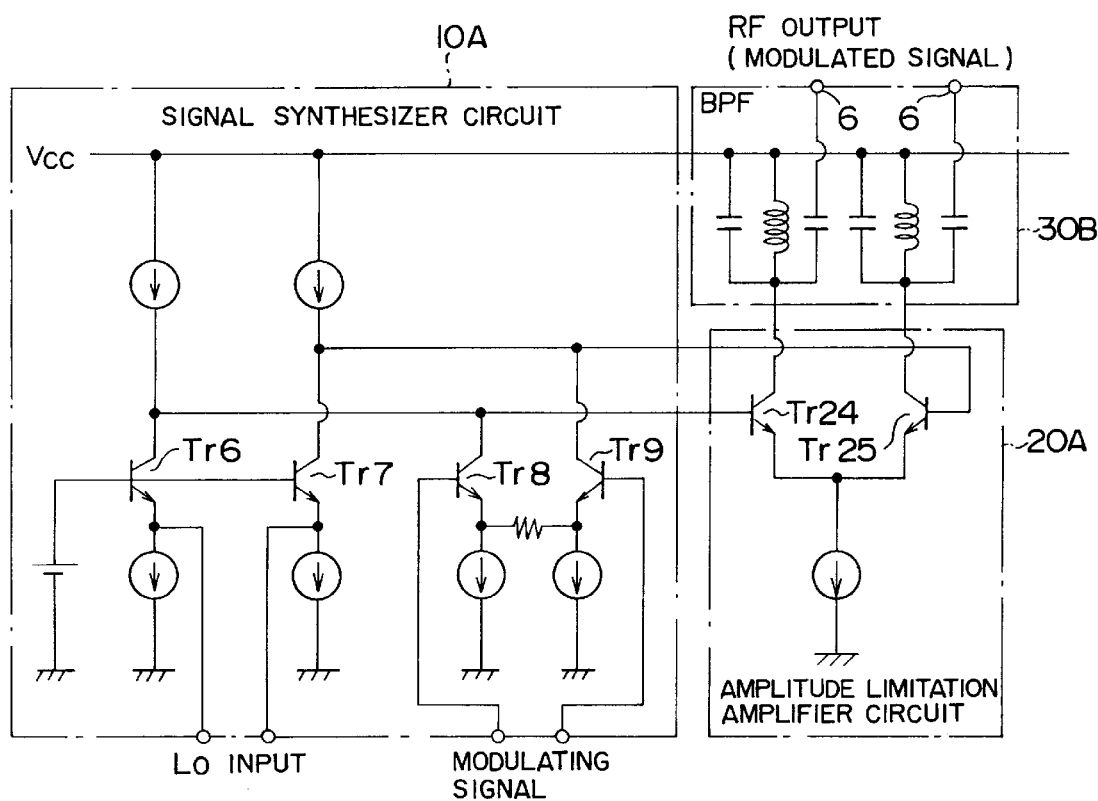
FIG. 16 is a circuit diagram illustrating the detailed construction of the frequency converter of FIG. 15.

FIG. 16 is a circuit diagram illustrating the detailed construction of the fourth preferred embodiment of the frequency converter shown in FIG. 15. In FIG. 16, the signal synthesizer circuit 10A comprises: a pair of transistors Tr6 and Tr7 for inputting local oscillation signals (Lo) to the emitters thereof; and a pair of transistors Tr8 and Tr9, the collectors of which are connected to the transistors Tr6 and Tr7, and the bases of which receive the modulating signals. The amplitude limitation amplifier circuit 20A comprises a differential amplifier which includes a transistor Tr24, the base of which receives the output at the connection point between the collectors of the transistors Tr6 and Tr8, and a transistor Tr25, the base of which receives the output at the connection point between the collectors of the transistors Tr7 and Tr9. The band-pass filter (BPF) 30A comprises: a pair of inductors connected to the pair of transistors Tr24 and Tr25 forming the differential amplifier; capacitors connected in parallel to the inductors; and terminals 6 for taking the RF output as a modulated signal out of the connecting point between a coil and the capacitor, another capacitor being provided between the terminals 6 and the connection points.

FIG. 17 is a block diagram of the fifth preferred embodiment of a frequency converter according to the present invention. In FIG. 17, the fifth preferred embodiment of the frequency converter comprises: a comparator 25 for inputting a high-frequency (RF) signal and a local oscillation (Lo) signal to compare these two signals; and a low-pass filter (LPF) 30 for inputting the output compared by the comparator 25 to allow only low-frequency components to pass therethrough.

With this construction, a high-frequency (RF) signal is inputted to one of input terminals of the comparator 25, and a local oscillation (Lo) signal is inputted to the other input terminal. The output of the comparator is either a high voltage (binary "1") and a low voltage (binary "0"). When the voltage of the first input terminal is higher than the input voltage of the second input terminal, the output of the comparator is the high voltage, and in the inverse case, it is the low voltage. Therefore, one comparator 25 can have two functions for signal synthesis and amplitude limitation. Similar to the first preferred embodiment, the output is pulse-width modulated by the amplitude of the high-frequency signal, and it is possible to take out a desired signal by removing undesired signal components by the LPF 30.

The comparator outputs a binary signal in accordance with the comparison of the amplitude of the first input signal with the amplitude of the second input signal. Therefore, two functions as the signal synthesizer means and the amplitude limitation amplifier means can be realized by only the comparator. Thus, since the construction of the frequency converter can be simplified, it is possible to decrease the size and cost of a radio communication apparatus.

Figure 19:
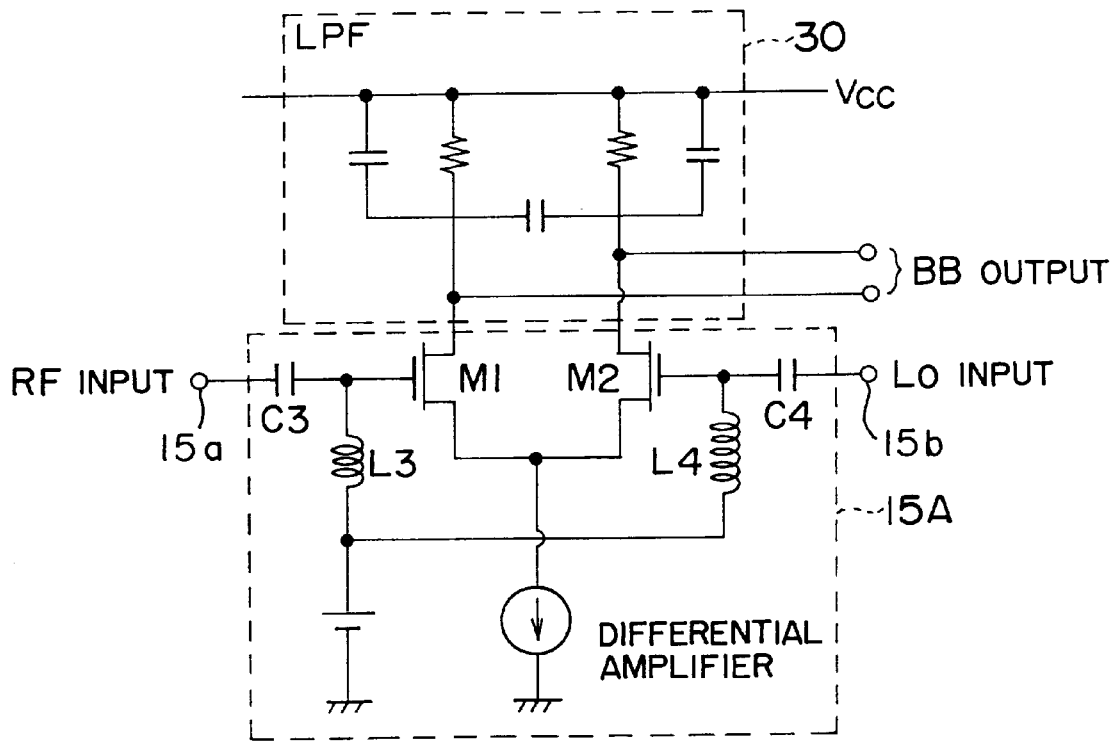
FIG. 19 is a circuit diagram of the seventh preferred embodiment of a frequency converter according to the present invention.

Referring to FIGS. 18 and 19, the sixth and seventh preferred embodiments of a frequency converter according to the present invention, which have specific constructions of the aforementioned fifth preferred embodiment, will be described below.

FIG. 18 is a circuit diagram of the sixth preferred embodiment of a frequency converter according to the present invention. In this preferred embodiment, a comparator comprises a differential amplifier 15 including a pair of transistors. A high-frequency signal is inputted to one input terminal 15a of the differential amplifier 15, and a local oscillation signal is inputted to the other input terminal 15b, so that one differential amplifier has functions of performing the signal synthesis and the amplitude limitation. A low-pass filter (LPF) 30 is connected to a load circuit of the differential amplifier 15. A frequency converter of a simplified construction is realized by the low-pass characteristic. That is, the differential amplifier 15 including bipolar transistors Tr41 and Tr42 has both the functions, which are the synthesis of signals and the limitation of an amplitude. In the figure, capacitor C3 and inductor L3 form an impedance matching circuit for the RF input, and C4 and L4 form an-impedance matching circuit for the Lo input.

In this sixth preferred embodiment, the comparator is realized by the differential amplifier, and the load circuit of the differential amplifier has the low-pass characteristic, so that a frequency converter of simplified construction is realized.

FIG. 19 is a circuit diagram of the seventh preferred embodiment of a frequency converter according to the present invention. This preferred embodiment includes a differential amplifier 15A wherein a field effect transistor (FET) is substituted for the bipolar transistor forming the differential amplifier 15 in the sixth preferred embodiment. That is, the differential amplifier 15A is constructed by field effect transistors (FETs) M1 and M2. This preferred embodiment has the same functions and constructions as those of the sixth preferred embodiment shown in FIG. 18, except that one differential amplifier performs the signal synthesis and the amplitude limitation and that the LPF 30 is connected as the load circuit of the differential amplifier 15A.

Figure 20:
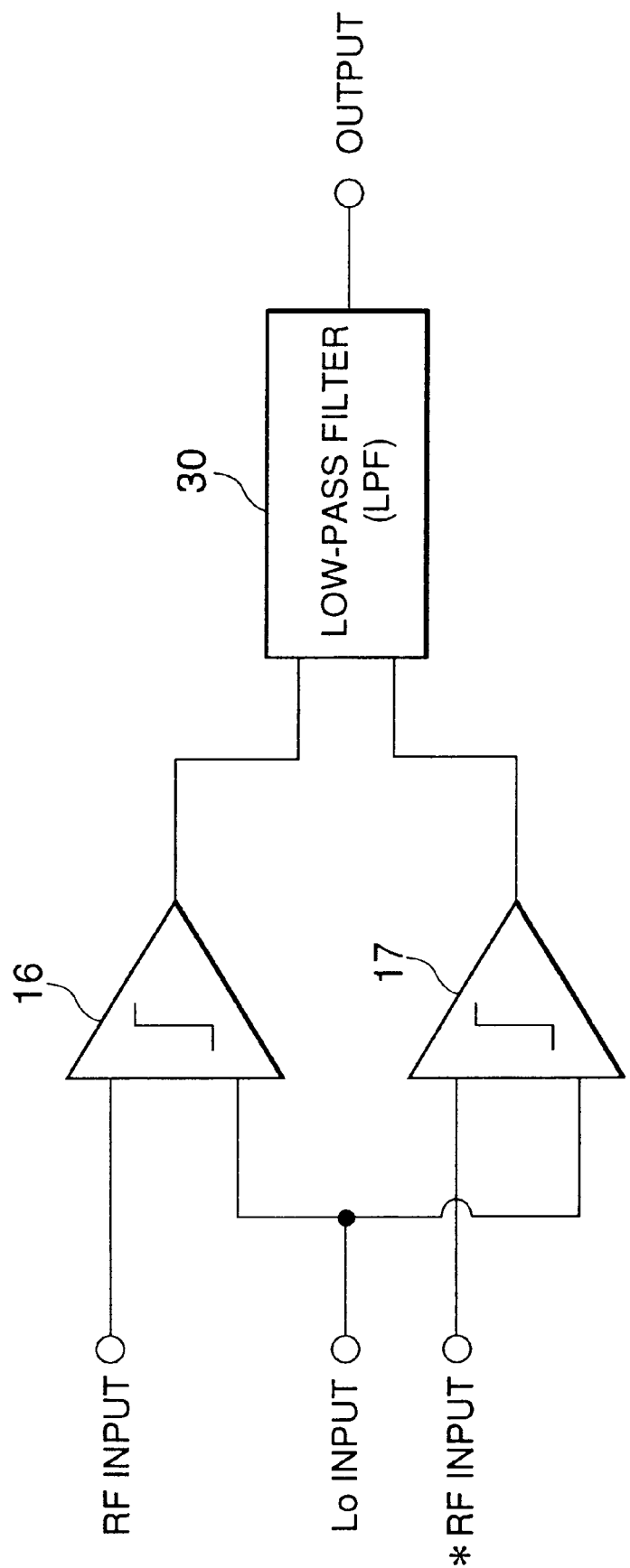
FIG. 20 is a block diagram of the eighth preferred embodiment of a frequency converter according to the present invention.
Figure 21:
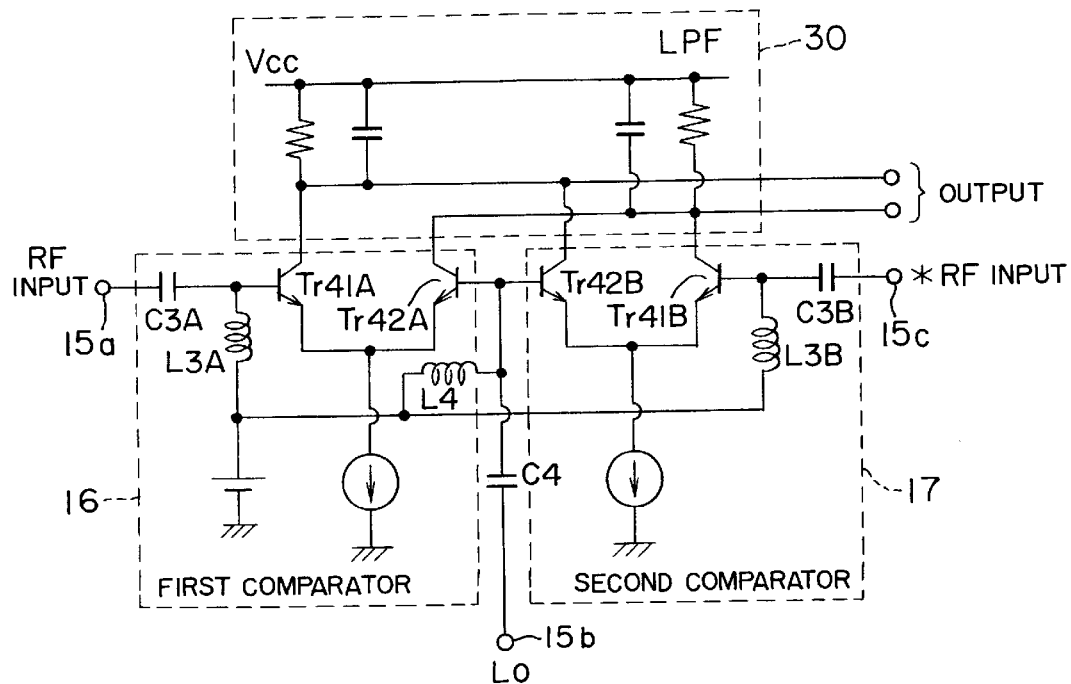
FIG. 21 is a circuit diagram of the eighth preferred embodiment of a frequency converter according to the present invention.

Referring to FIGS. 20 and 21, the eighth preferred embodiment of a frequency converter according to the present invention will be described below.

As shown in FIG. 20, this preferred embodiment includes a pair of comparators, each of which is the same as the comparator in the fifth preferred embodiment of the frequency converter shown in FIG. 17. In FIG. 20, a first comparator 16 compares a high-frequency (RF) signal with a local oscillation (Lo) signal, and a second comparator 17 compares a high-frequency inverted (*RF) signal with a local oscillation (Lo) signal, so that the outputs of the respective comparators are inputted to a low-pass filter (LPF) 30. The low-pass filter 30 synthesizes the outputs of the first and second comparators 16 and 17, and allows only low-frequency components to pass therethrough.

FIG. 21 is a circuit diagram illustrating the detailed construction of the eighth preferred embodiment of a frequency converter according to the present invention. In FIG. 21, the frequency converter comprises the LPF 30, the first comparator 16 and the second comparator 17. High-frequency (RF) signals are supplied to the bases of transistors, each of which is one of transistors forming the comparator, and an inverted high-frequency (*RF) signals are supplied via a terminal 15c to the bases of transistors, each of which is the other transistor. That is, the high-frequency (RF) signals are supplied to a base of a bipolar transistor Tr41A through capacitor C3A and inductor L3A forming an impedance matching circuit for the RF signals, and the inverted high-frequency (*RF) signals are supplied to a base of a bipolar transistor Tr41B through capacitor C3B and inductor L3B forming an impedance matching circuit for the *RF signals. Further, the local oscillation (Lo) signals are supplied to bases of bipolar transistors Tr42A and 42B through capacitor C4 and inductor L4 forming an impedance matching circuit for the Lo signals.

In a case where a comparator is formed by a differential amplifier, an in-phase mode signal is also outputted under the influence of a parasitic capacity and so forth. In particular, it is difficult to increase the common-mode rejection ratio (CMRR) at a high frequency. In the sixth and seventh preferred embodiments, since the frequency converter inputs the local signal and the high-frequency signal to only one of the input terminals, the distortion of the in-phase mode appears at the output when the common-mode rejection ratio can not be increased. Since the distortion of the in-phase mode also includes even-degree distortion, it is not possible to obtain the advantage of an even higher-harmonic mixer that the common mode rejection ratio is small.

In the eighth preferred embodiment of the frequency converter, two differential circuits are combined in order to remove the distortion of the in-phase mode. Local signals are, in-phase, inputted to both of differential circuits. The output currents of both differential amplifiers are pulse-width modulated by high-frequency inputs. However, since the high-frequency inputs are reversed phases, when the pulse width of one of the output currents is increased, the pulse width of the other output current is decreased. For that reason, when both of the differential terminals are connected so that the pulses, i.e. the local signal inputs, cancel each other, desired output components intensify each other to be outputted. With respect to the distortion, although the distortion components odd times as large as the high-frequency signal are outputted, the components even times as large as the high-frequency signal are not outputted since they cancel each other.

Figure 22:
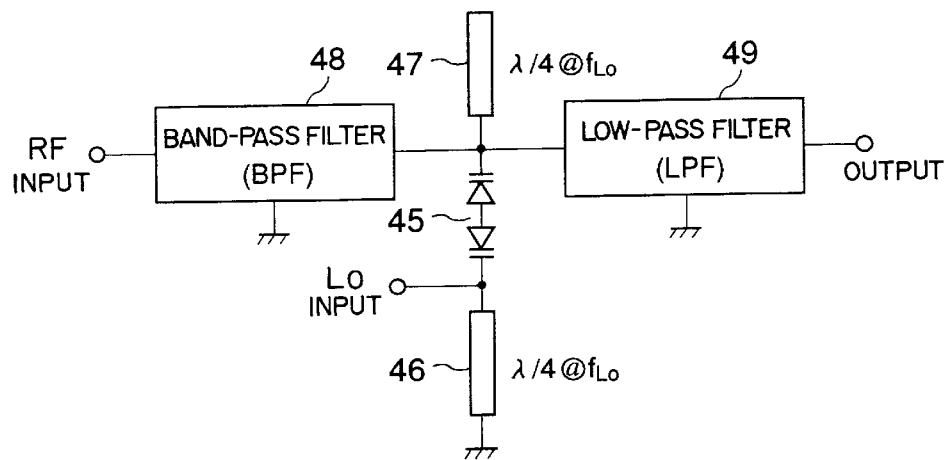
FIG. 22 is a block diagram of the ninth preferred embodiment of a frequency converter according to the present invention.

FIG. 22 is a block diagram of the ninth preferred embodiment of a frequency converter according to the present invention. In this preferred embodiment, a local oscillation signal (Lo) input is supplied to one terminal of a series circuit 45, to which non-linear element (a variable-capacitor diode in the figure) is connected in series. The input terminal for the local oscillation signal (Lo) is a short stub 46 which is connected to the ground via a transmission line of a fourth wavelength at the frequency of the local oscillation signal. The short stub 46 appears to be a short-circuit at direct currents and at frequencies even times as large as the local oscillation frequency. An open stub 47 of a fourth wavelength is connected to the other terminal of the non-linear element series circuit 45. Since the fourth-wavelength open stub 47 has a low impedance at the local oscillation frequency, the local oscillation signal voltage is applied to both ends of the non-linear element series circuit 45. Since the high-frequency input signal is substantially even times as large as the local oscillation signal, the open stub 47 appears to be open, and the short stub 46 appears to be a short-circuit. For that reason, the high-frequency signal voltage passing through the band-pass filter (BPF) 48 is applied to both ends of the non-linear element series circuit 45. Since the current of the non-linear element series circuit 45 has the odd function characteristic, it includes many odd-degree distortions, and low-frequency components of the odd-degree distortions are taken out by means of the low-pass filter 49 to be outputted.

Thus, although the characteristic in that the conversion gain of frequencies even times as large as the frequency of a local oscillation signal is great and the conversion gain of frequencies odd times as large as the frequency of the local oscillation signal, is efficiently realized by an amplitude limitation amplifier circuit, it can be realized using a circuit wherein the input and output characteristics are non-linear and odd function. However, since an anti-parallel diode pair utilizes the conducting state and the non-conducting state of a diode, it is required to input a great local oscillation signal as described above. On the other hand, like the anti-parallel diode pair, the odd function characteristic can be realized by connecting non-linear elements in series in the opposite directions. In a case where usual diode elements are used, since at least one diode is in non-conducting state, no current flows. However, when elements such as variable-capacity diodes are connected in series in the opposite directions, a signal current flows through the capacitor and the capacity fluctuates depending upon the signal voltage, so that the frequency conversion can be performed. By using elements wherein the capacity greatly varies by a small voltage, it is possible to form a frequency converter which has a good conversion efficiency even if a local oscillation signal is small.

Furthermore, while a diode pair 45 has been used as non-linear elements in the ninth preferred embodiment of FIG. 22, transistors may be substituted for the diode pair 45 as the tenth preferred embodiment. FIGS. 23 and 24 illustrate the tenth preferred embodiment of a frequency converter according to the present invention.

In FIG. 23, a series circuit 43 of transistors formed by connecting metal oxide layer semiconductor (MOS) transistors 41 and 42 of depletion type in series, is substituted for the diode pair 45. This series circuit 43 of transistors is a non-linear element having the odd function characteristic. In addition, a depletion type MOSFET dual-gate transistor 44 may be substituted for the series circuit 43 of transistors of FIG. 23 as the tenth preferred embodiment shown in FIG. 24. In this case, the same functions and advantageous effects can be expected.

In addition, by connecting non-linear elements in the opposite directions to supply a bias voltage or a current to the connection point, it is possible to form a frequency mixer which can be operated even if the input of a local oscillation signal is small. When diode elements are connected in series in the opposite directions so that a bias current flows therethrough, the current passing through both of the diodes is limited by the bias current, so that it can be operated as an amplitude limitation circuit similar to a differential pair of transistors. In the case of an anti-parallel diode pair, the signal current itself must be increased to a voltage causing the diodes to be in conducting state. However, since a series diode pair of the present invention is preset to be in conducting state, it has the non-linear characteristic by a small input signal, so that it is possible to efficiently perform the frequency conversion.

FIG. 25 is a block diagram of the eleventh preferred embodiment of a frequency converter according to the present invention. A frequency converter circuit, which can be operated by a local oscillation signal of a small amplitude, is formed by providing a current source 51 for supplying a bias current to a series circuit 50 of non-linear elements (diodes), and an inductor 52. In FIG. 25, one end of the constant-current source 51, the other end of which is connected to the ground, is connected to the connection point of the non-linear elements of the series circuit 50. In addition, one end of the inductor 52, the other end of which is connected to the ground, is connected to the common connection point of the series circuit 50, an open stub 47, a BPF 48 and a LPF 49. Other constructions are the same as those of the ninth preferred embodiment of the frequency converter shown in FIG. 22, and this converter can be also operated by a small oscillation signal.

Furthermore, while a baseband signal has been prepared from a high-frequency signal using one signal synthesizer circuit 10 and one amplitude limitation amplifier circuit 20 in the first preferred embodiment of the frequency converter shown in FIG. 2, the present invention should not be limited thereto. As the twelfth preferred embodiments shown in FIGS. 26 through 28, a signal synthesizer circuit for synthesizing a high-frequency signal with a local oscillation signal and a signal synthesizer circuit for synthesizing an inverted signal of the local oscillation signal with the high-frequency signal are connected in parallel, and amplitude limitation amplifier circuits may be connected to these signal synthesizing circuits, respectively, so that two amplitude limitation amplifier circuits are connected to filter means.

Figure 26:
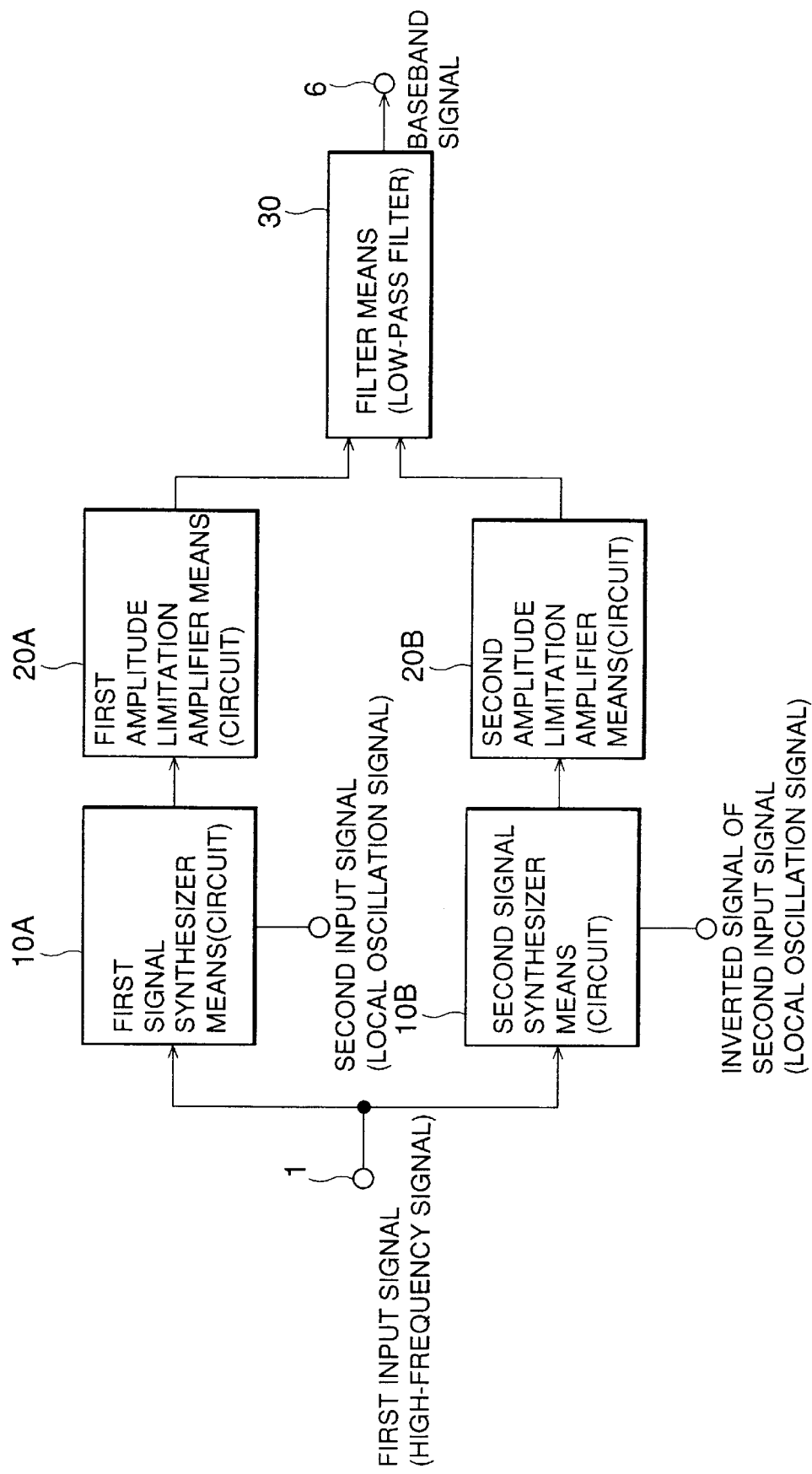
FIG. 26 is a block diagram of the twelfth preferred embodiment of a frequency converter according to the present invention.

FIG. 26 is a block diagram of the twelfth preferred embodiment of a frequency converter according to the present invention. In FIG. 26, similar to the first preferred embodiment of the frequency converter shown in FIG. 2, first signal synthesizer means 10A and first amplitude limitation amplifier means 20A output an amplitude information of a first input signal (a high-frequency signal such as RF) as a pulse-width modulating signal. In addition, second signal synthesizer means 10B and second amplitude limitation amplifier means 20B output an amplitude information of the first input signal as a pulse-width modulating signal, similar to the first preferred embodiment. Both of the PWM modulating signals outputted from the first and second amplitude limitation amplifier means 20A and 20B are synthesized by the filter means 30, so that it is possible to take out a desired frequency component.

The twelfth preferred embodiment of the frequency converter is characterized that an inverted signal of a second input signal (a local oscillation signal) is inputted to a second signal synthesizer means 10B. The second input signal and the inverted signal thereof which are inputted to the first and second signal synthesizer means 10A and 10B leak in an input terminal for inputting the first input signal. Since the second input signal inputted to the second signal synthesizer means 10B is an inverted signal, the leakage signal thereof is also an inverted signal of the leakage signal of the first signal synthesizer means 10A. Therefore, the second input signals leaking out of the first and second signal synthesizer means 10A and 10B cancel each other, so that the leakage appears to be small. When the leakage signal is decreased, the reflected signal is also decreased, so that it is possible to further decrease a DC offset due to the self-mixing of the local oscillation signal.

Figure 27:
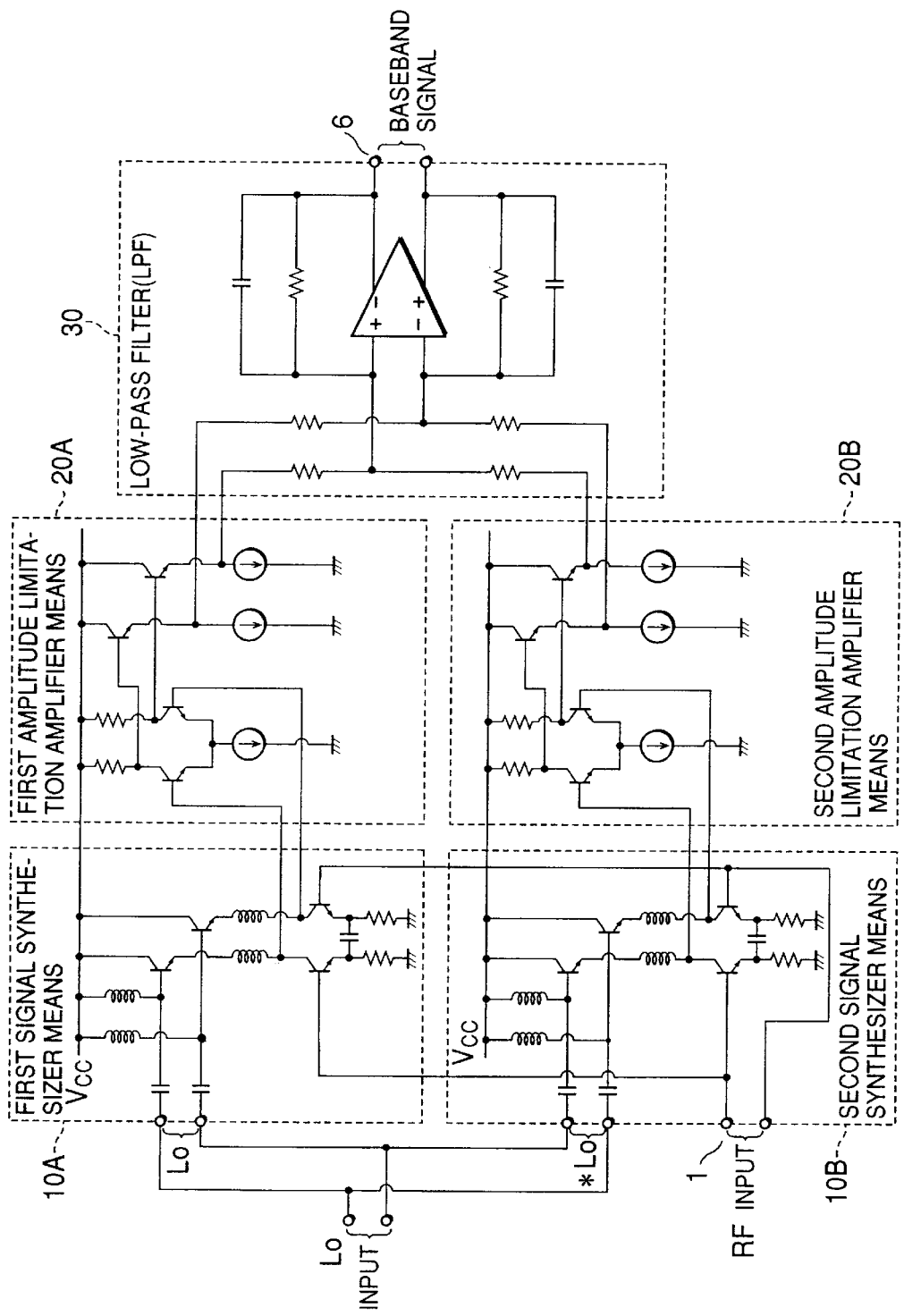
FIG. 27 is a circuit diagram of the thirteenth preferred embodiment of a frequency converter according to the present invention, which serves as a specified embodiment of FIG. 26.

FIG. 27 is a circuit diagram the thirteenth preferred embodiment of a frequency converter according to the present invention, which serves as a first specified embodiment of the twelfth preferred embodiment of the frequency converter. In FIG. 27, since a local oscillation (Lo) signal serving as a second input signal is a differential signal, it is possible to simply produce a local oscillation inverted (*Lo) signal by forming signal lines as shown in this figure. The first signal synthesizer means 10A and the second signal synthesizer means 10B have the same construction, except for the connection of the differential input for a local oscillation signal serving as a second input signal. In addition, the first amplitude limitation amplifier means 20A and the second amplitude limitation amplifier means 20B have the same construction. Since the respective circuit constructions are the same as those of the respective circuit of the first preferred embodiment of the frequency converter shown in FIG. 3, the repeated descriptions are omitted.

Figure 28:
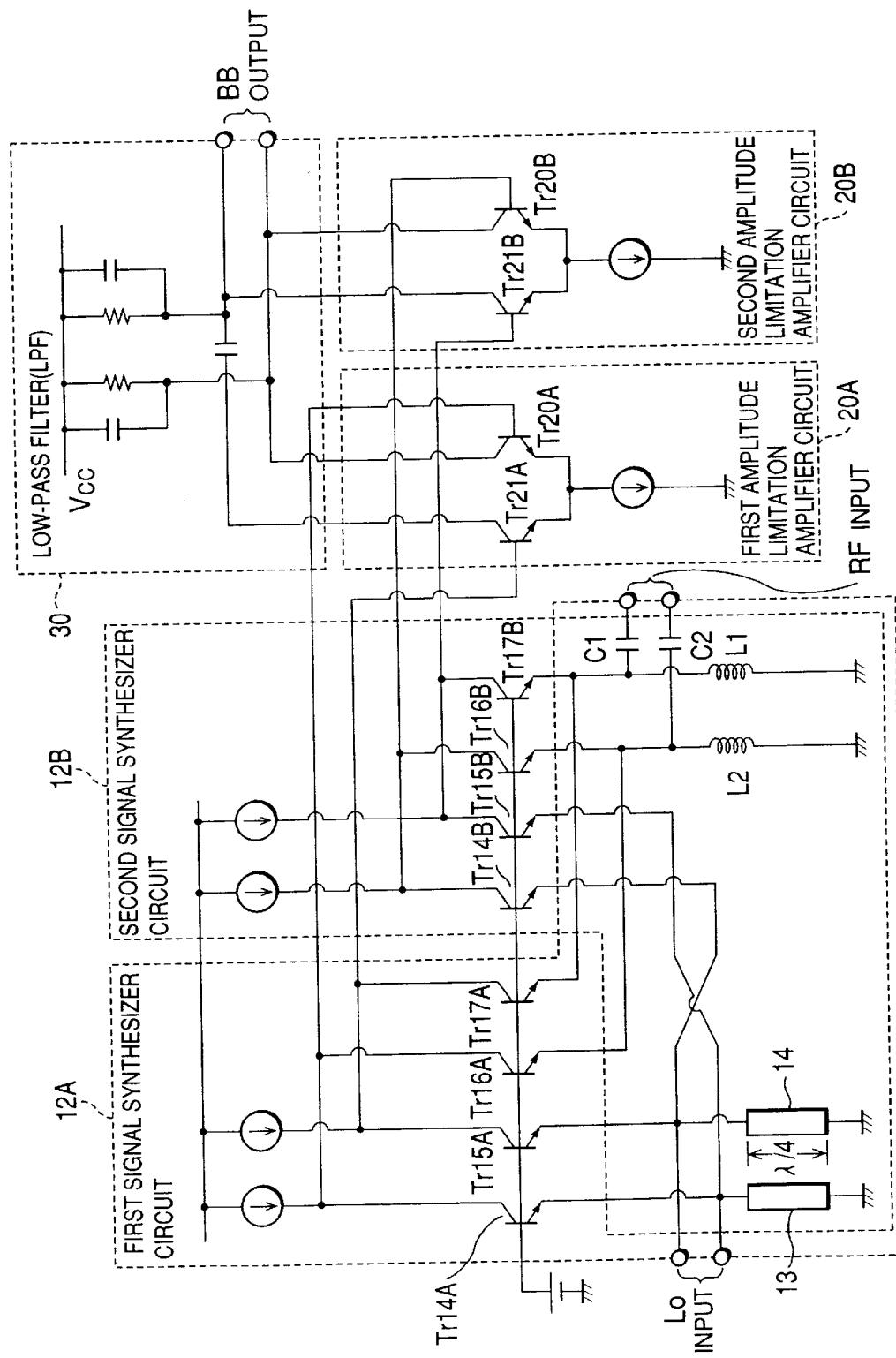
FIG. 28 is a circuit diagram of the fourteenth preferred embodiment of a frequency converter according to the present invention, which illustrates another circuits as a specified embodiment of FIG. 26.

FIG. 28 is a circuit diagram the fourteenth preferred embodiment of a frequency converter according to the present invention, which serves as a second specified embodiment of the twelfth preferred embodiment of the frequency converter. In this preferred embodiment, the first signal synthesizer circuit 10A and the second signal synthesizer circuit 10B commonly use an impedance matching circuit for the first input (RF) signal and even-times wave control means for the second input (Lo) signal, so as to decrease the number of parts. Similar to the second preferred embodiment of the frequency converter shown in FIG. 11, since means for removing noises from the second input (Lo) signal is provided, it has a good noise characteristic. In addition, similar to the thirteenth preferred embodiment, the leakages of the local oscillation (Lo) signals cancel each other at the outputs of the first and second signal synthesizer circuits 12A and 12B, so that the offset due to the self-mixing is very small. Furthermore, the specific circuits of the first and second signal synthesizer circuits 12A and 12B commonly have an impedance matching circuit constructed by short stubs 13 and 14 as an even higher-harmonic frequency suppression means, capacitors C1 and C2 and inductors L1 and L2. Other constructions of the circuits 12A and 12B are the same as those of FIG. 11, but only a different portion between circuits in FIG. 11 and 28 is a replacement of differential inputs of the local oscillation signals. Further, the constructions of the first and second amplitude limitation amplifier circuits 20A and 20B are the same as that of the amplitude limitation amplifier circuit 20A of FIG. 11, so that the repeated descriptions are omitted.

Figure 29:
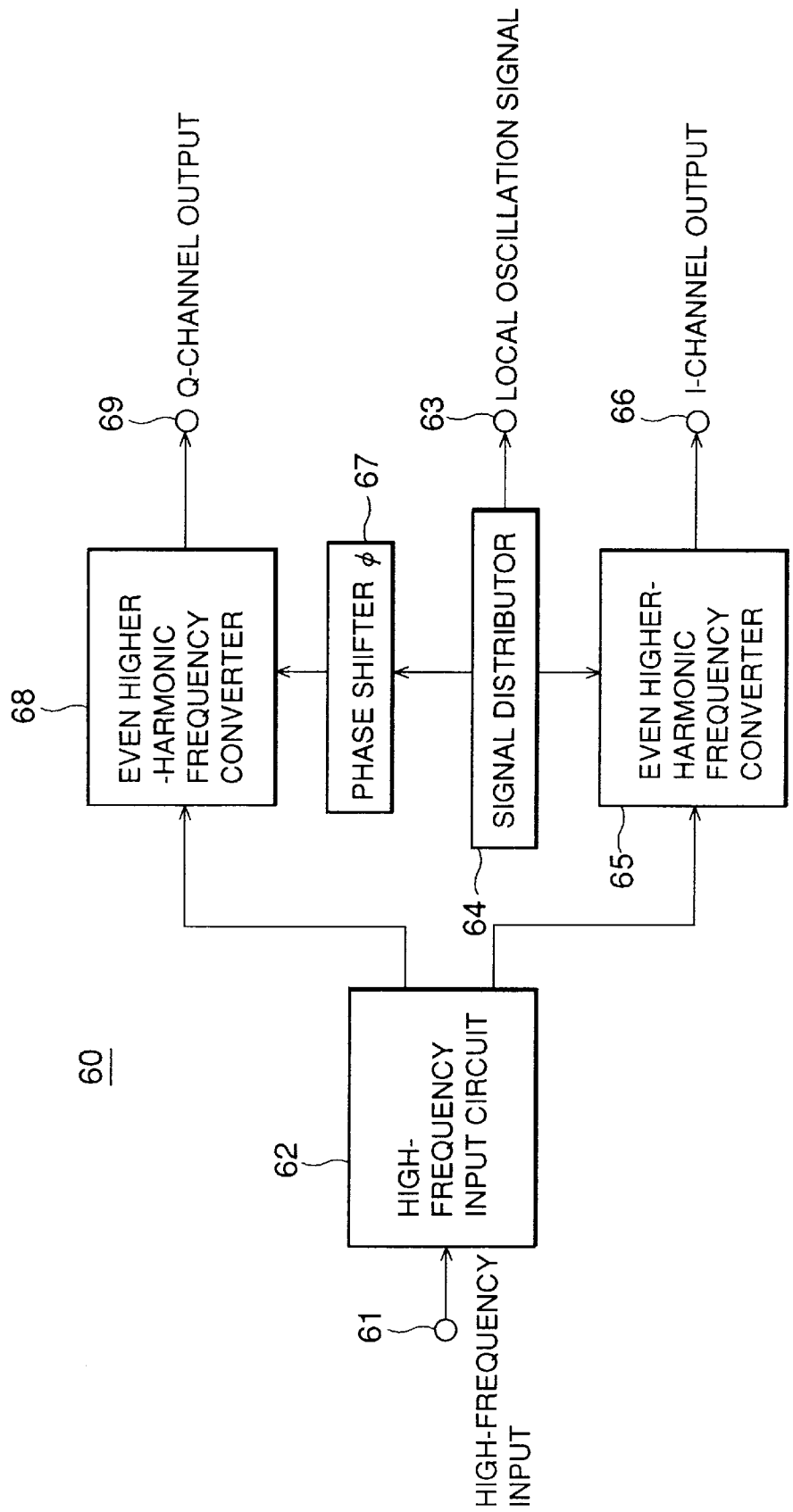
FIG. 29 is a block diagram of the fifteenth preferred embodiment of a radio receiver using a frequency converter according to the present invention.

FIG. 29 is a block diagram of the fifteenth preferred embodiment of a frequency converter according to the present invention. In FIG. 29, a radio receiver 60 comprises: a terminal 61, to which a high-frequency signal (RF) input is provided; a high-frequency input circuit 62 for receiving the high-frequency signal supplied via the terminal 61; a terminal 63 for inputting a local oscillation (Lo) signal; a signal distributor 64 for distributing the inputted local oscillation signal to two signal components; an even higher-harmonic frequency converter 65 for converting the output of the high-frequency input circuit 62 into a baseband using the local oscillation signal distributed by the signal distributor 64; a terminal 66 for outputting the converted baseband as an I-channel component; a phase shifter 67 for shifting the phase of the local oscillation signal divided by the signal divider 64; an even higher-harmonic frequency converter 68 for converting the output of the high-frequency input circuit 62 into a baseband using the phase-shifted local oscillation signal; and a terminal 69 for outputting the converted even higher-harmonic as a Q-channel component.

In this preferred embodiment, the receiver has an orthogonal demodulator formed by two even higher-harmonic frequency converters. In a case where a transmission line is used as the phase shifter 67, since the input-output impedance of the signal divider 64 must be matched with the transmission line impedance, the signal amplitude is decreased by 3dB. On the other hand, the thermal noises inputted from the transmission line to the frequency converters 65 and 68 are constant if the transmission line impedance is constant. For that reason, in a case where the phase of the high-frequency input signal divided in half is shifted by $\pi/2$, the signal to noise ratio is deteriorated by about 3 dB. In order to obtain two signals of the same phase and amplitude, the inputs of the frequency converters 65 and 68 may be connected in parallel, to impedance-match with the transmission line. In this case, since both of the signal and noise are reduced to half, there is no deterioration of the signal to noise ratio. Therefore, it is advantageous to the signal to noise ratio that no phase shifter is used in the higher harmonic input circuit 62. Similarly, the signal to noise (S/N) ratio deteriorates when the phase of the local oscillation input is shifted using a transmission line.

However, in the even higher-harmonic frequency converter circuits 65 and 68, the noise components even times as large as the frequency of the local oscillation signal strongly appears at the output thereof, and the noise components odd times as the frequency of the local oscillation signal has a small influence thereon. Since the frequency of a required signal is different from the frequency of the noise, it is possible to prevent the deterioration of the signal to noise ratio due to the signal divider circuit by providing even-times wave suppressing means. Furthermore, since it is twice as large as the frequency of the high-frequency signal, a $\pi/2$ phase shifter for the high-frequency signals and a $\pi/4$ phase shifter for the local oscillation signal are transmission lines of the same length.

Figure 30:
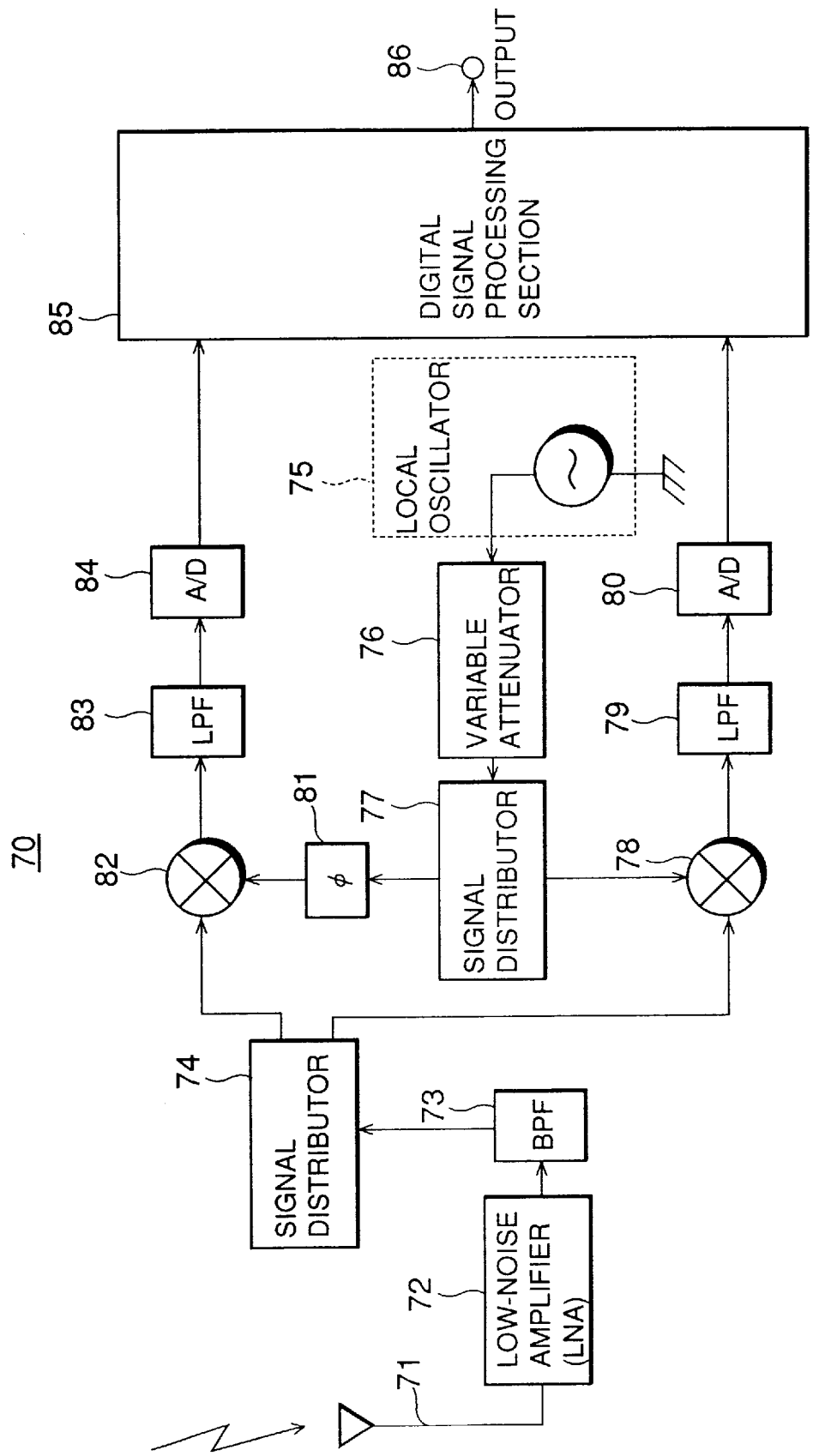
FIG. 30 is a block diagram of the sixteenth preferred embodiment of a radio receiver using a frequency converter according to the present invention.

FIG. 30 is a block diagram of the sixteenth preferred embodiment of a frequency converter according to the present invention. In FIG. 30, a radio receiver 70 comprises: an antenna 71 for receiving a high-frequency signal such as a radio frequency (RF) signal; a low noise amplifier (LNA) 72 for amplifying the received high-frequency signal with low noises; a BPF 73 for band-filtering the amplified output of the LNA 72; a local oscillator 75 for producing a local oscillation signal; a variable attenuator for variably attenuating the local oscillation signal; a signal distributor 77 for distributing the attenuated local oscillation signal; a multiplier 78 for multiplying one of the distributed oscillation signals by the RF signal distributed by the signal distributor; a LPF 79 for allowing the passage of low-frequency components of the output of the multiplier 78 to filter the output of the multiplier 78; an A/D converter 80 for converting an analog output of the LPF 79 into a digital signal; a phase shifter 81 for shifting the phase of the other local oscillation signal distributed by the signal distributor 77, by a predetermined amount; a multiplier 82 for multiplying the distributed and phase-shifted other local oscillation signal by the RF signal distributed by the signal distributor; a LPF 83 for allowing the passage of low-frequency components of the output of the multiplier 82 to filter the output of the multiplier 82; an A/D converter 84 for converting an analog output of the LPF 83 into a digital signal; a digital signal processing section 85 for processing the digital signals outputted from the A/D converters 80 and 84; and a terminal 86 for outputting the processed digital signals.

Figure 31:
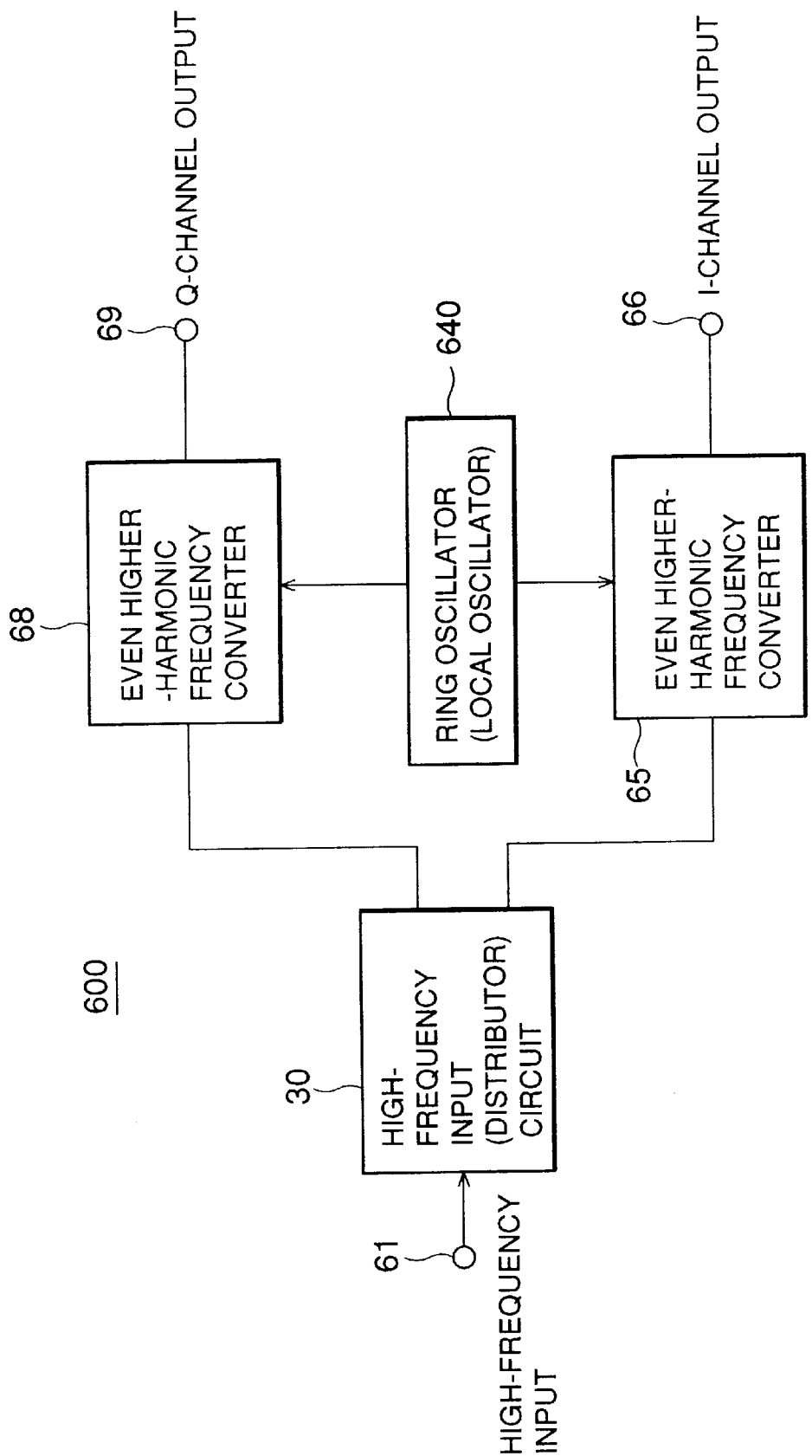
FIG. 31 is a block diagram of the seventeenth preferred embodiment of a radio transmitter-receiver according to the present invention.
Figure 32:
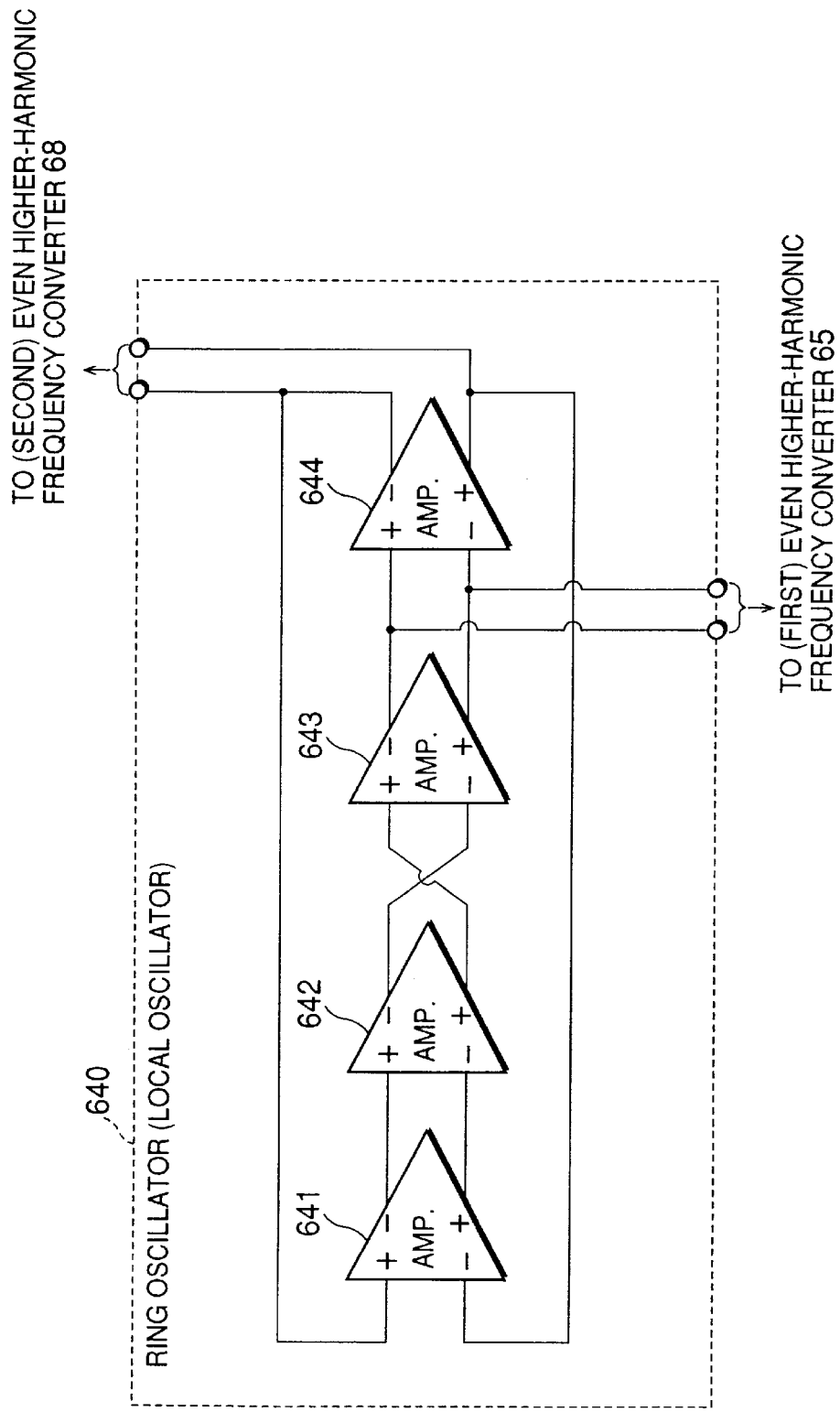
FIG. 32 is a block diagram of an embodiment of a ring oscillator in FIG. 31.
Figure 33:
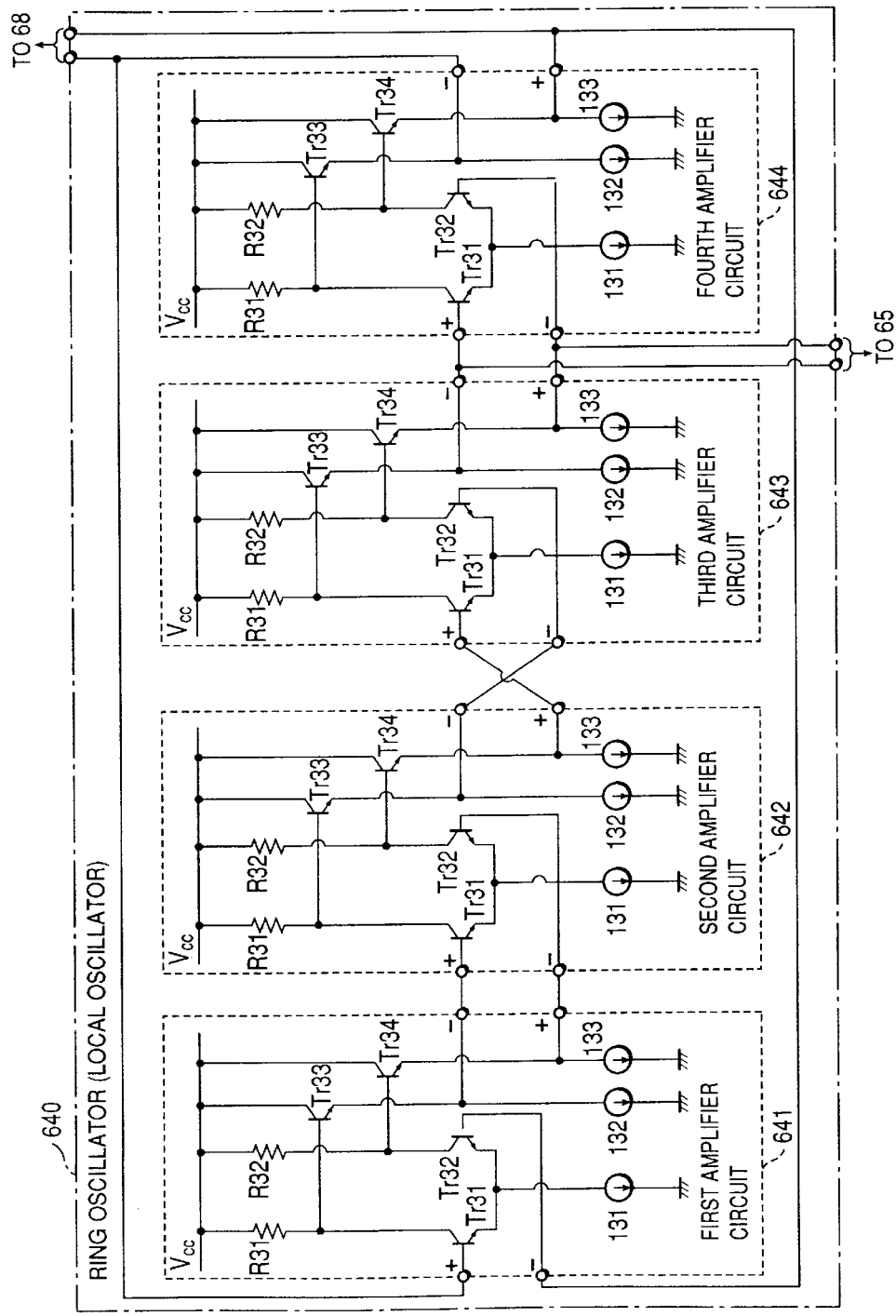
FIG. 33 is a circuit diagram illustrating the detailed construction of the ring oscillator of FIG. 32.

Furthermore, in the fifteenth preferred embodiment of the radio receiver shown in FIG. 29, the local oscillation signal has been divided to half using the signal distributor 64 and the phase shifter 67 so as to shift one phase by $\pi/4$. Referring to FIGS. 31 through 33, such distribution and phase shifting of signals will be described. In the seventeenth preferred embodiment of a frequency converter shown in FIG. 31, a radio receiver 600 has a ring oscillator 640 which includes the input terminal 63 for the local oscillation signal, the signal distributor 64 and the phase shifter 67 in the radio receiver 60 of FIG. 29.

As shown in FIG. 31, in the seventeenth preferred embodiment of the radio receiver, the ring oscillator 640 outputs two local oscillation signals, the phases of which are shifted by $\pi/4$ from another, to a first even higher-harmonic frequency converter 65 and a second even higher-harmonic frequency converter 68. As shown in FIG. 32, the ring oscillator 640 serving as a local oscillator comprises four-stage full-differential amplifiers wherein positive (+) and negative (−) terminal outputs are connected to negative (−) and positive (+) terminal inputs at the next stage, respectively, except for one stage. That is, a first amplifier 641, a second amplifier 642, a third amplifier 643 and a fourth amplifier 644 are connected as illustrated in the figure, the differential output of the third amplifier 643 is supplied to the first even higher-harmonic frequency converter 65, and the differential output of the fourth amplifier is supplied to the second even higher-harmonic frequency converter 68. Since the phase difference of the adjacent amplifiers is $\pi/4$, the phase difference of the third amplifier 643 and the fourth amplifier 644 is also $\pi/4$, so that it can have both of the signal distribution function and the $\pi/4$ phase shifting function.

Referring to FIG. 33, the detailed circuit construction of the local oscillator 640 in the seventh preferred embodiment of the radio receiver will be described. In FIG. 33, the respective amplifier circuits 641, 642, 643 and 644 have the same construction. Specifically, each of these amplifier circuits comprises: a differential pair of transistors Tr31 and Tr32 for receiving positive (+) and negative (−) inputs to the base electrodes thereof; a transistor Tr33 for receiving the potential at the connection point of the transistor Tr31 and the resistor R31 to the base thereof; a transistor Tr34 for receiving the potential at the connection point of the transistor Tr32 and the resistor R32 to the base thereof; and current sources I31, I32 and I33 provided on the sides of the emitters of the respective transistors. Thus, the full-differential amplifier can be realized by a differential amplifier circuit having an emitter follower at the output stage thereof.

While the four-stage ring oscillator has been used in the seventeenth preferred embodiment of the frequency converter, the present invention should not be limited thereto. If a "4×N" stage ring oscillator having a phase difference of π/4 per N stages is used, the same results as those of the seventeenth preferred embodiment of the frequency converter can be obtained.

Furthermore, the distribution and phase shifting have been performed using the four-stage ring oscillator in the seventeenth preferred embodiment of the frequency converter. However, in order to realize a frequency converter using a harmonic mixer (HMIX), it is required to provide signals phase-shifted by 45 degrees as local oscillation signals for I-channel and Q-channel, so that the phase shifter for obtaining such a phase-shifted signal may comprise a bridge circuit as shown in FIG. 34.

FIG. 34 is a circuit diagram of the eighteenth preferred embodiment of a frequency converter according to the present invention. In this figure, a local oscillator 330 outputs a frequency of half of a desired oscillation frequency. One end of the local oscillator 330 is connected to a terminal 36, and the other end is connected to the ground via a terminal 37. Between the terminals 36 and 37, a RC series circuit comprising a resistor R33 and a capacitor C33, and a RR series circuit comprising resistors R34 and R35 are connected in parallel. A connection terminal 38 of the resistor R33 and the capacitor C33 of the RC series circuit is connected to an input terminal of a first amplitude limitation circuit 41 including a buffer circuit. An output terminal of the first amplitude limitation circuit 41 is connected to an input terminal of a first low-pass filter (LPF) 43, and the output of the first LPF is outputted via a terminal 55. In addition, the connection terminal 39 of the resistors R34 and R35 of the RR series circuit is connected to an input terminal of a second amplitude limitation circuit 42 including a buffer. An output terminal of the second amplitude limitation circuit is connected to an input terminal of a second LPF 44, and the output of the second LPF is outputted via a terminal 56.

With this construction, the operation of the phase shifter will be described. In order to simplify the explanation, it is assumed that the resistors R33, R34 and R35 have the same resistance R, and the capacity C of the capacitor C33 is C=1/(½*wc*R). It is also assumed that the first and second amplitude limitation circuits 41 and 42 have the same characteristic to limit the amplitude to a predetermined value after amplifying the respective signals. In addition, it is assumed that the first and second LPF 43 and 44 allow "½*wc" to pass therethrough, and the higher harmonics integer times (particularly odd times) as large as the ½*wc" are sufficiently attenuated. Assuming that the output voltage of the local oscillator 330 is V, the following voltage V(38) occurs at the output terminal 38.

$$V(38)=(1/jwcC)/(R+1/jwcC)V=\tfrac{1}{2}(1-j)V$$

Similarly, the following voltage V(39) occurs at the terminal 39.

$$V(39)=(R/2R)V=\tfrac{1}{2} V$$

Therefore, output signals which have a different amplitude from another and which are phase-shifted by 45 degrees from another, appear at the terminals 38 and 39. In this case, the phase difference is expressed by the following formulae.

$$I33 = V/(R+1/jwc) = V/R(1-j) \quad (R=1/wc)$$

$$I34 = V/2R$$

$$V33/V = (1/jwc)/\{R+(1/jwc)\}$$

$$= -j/(1-j) = 1/(1+j) = 1/2(1-j)$$

$$= \sqrt{2}/2\angle 45°$$

$$V34/V = R/2R = 1/2\angle 0°$$

The amplitude limitation circuits 41 and 42 are connected downstream of the phase shifter so that the amplitudes of the output signals are equal to each other at the terminals 38 and 39. By these amplitude limitation circuits 41 and 42, the amplitudes of two output signals of the phase shifter are equal to each other. However, in this case, since the higher harmonics integer times as large as the ½*wc occur simultaneously, the higher harmonics integer times as large as the ½*wc are designed to be attenuated by the first and second LPFs 43 and 44 at the next stage.

While the resistance of the RC series circuit has been the same as that of the RR series circuit in the eighteenth preferred embodiment of the phase shifter, the present invention should not be limited thereto. For example, as the nineteenth preferred embodiment shown in FIG. 35, the ratio of the resistors R34 and R35 may be R34/R35=√2−1.

By such a construction, a first buffer 53 may be substituted for the amplitude limitation circuit 41 and the first LPF 43 in the eighteenth preferred embodiment of the phase shifter shown in FIG. 34, and a second buffer 54 may be substituted for the amplitude limitation circuit 42 and the second LPF 44 therein. In this nineteenth preferred embodiment, the phase shifter is the same as the eighteenth preferred embodiment of the phase shifter, except for the resistance ratio of the resistors R34 and R35 and the substituted first and second buffers 53 and 54. Therefore, the replaced descriptions are omitted using the same reference numbers.

The twentieth preferred embodiment of a frequency converter according to the present invention will be described below. FIG. 36 is a block diagram illustrating the construction of a phase shifter in the twentieth preferred embodiment. In this figure, a phase shifter 100 comprises: an input terminal 101 for inputting a local oscillation (Lo) signal; a π/2 phase shifter 102 for producing and outputting signals of "sin(ωt)" and "cos(ωt)" on the basis of a Lo input signal having a phase angle of "sin(ω)" inputted through the terminal 101; an adder 103 for adding two signals outputted from the phase shifter 102; amplitude limiters 104 and 105 for limiting the amplitudes of the "sin(ωt)" signal of the phase shifter 102 and the output signal of the adder 103; low-pass filters (LPFs) 106 and 107 for taking only the terms of angular frequency ωout of the respective outputs of the limiters 104 and 105; and output terminals 108 and 109 for signals outputted from the LPF 106 and 107, each signal having a phase which is shifted by π/4 from another.

With this construction, the operation of the phase shifter 100 will be described below.

The adding operation of the adder 103 is performed by the following formula.

$$\sin(\omega t)+\cos(\omega t)=\sqrt{2}\sin(\omega t-\pi/4)$$

Two signals inputted to the adder 103 have angular frequencies shown in FIG. 36. That is, a signal 111 having "sin(ωt)" and a signal 112 having "cos(ω)" orthogonal thereto are inputted to the adder 103 to be added to form a signal 113 which is phase shifted by π/4 from the signal 111. The signal 111 is supplied to the limiter 104, and the signal 113 is supplied to the limiter 105. The outputs L1 and L2 of the limiters 104 and 105 are obtained by the following formulae.

$$L1 = 4/\pi\{\sin(\omega t) + \tfrac{1}{3}\sin(3\omega t) + \tfrac{1}{5}\sin(5\omega t) + \ldots\}$$

$$L2 = 4/\pi\sin(\omega t - \pi/4) + \tfrac{1}{3}\sin(3\omega t - 3\pi/4) + \tfrac{1}{5}\sin(5\omega t - 5\pi/4) + \ldots\}$$

It only the terms of angular frequency are taken out of the outputs of these limiters 104 and 105 by means of the LPFs 106 and 107, 4/π·sin(ωt) and 4/π·sin(ωt−π/4) are obtained. Therefore, signals having a phase shifted by π/4 from another can be obtained at two output terminals 108 and 109.

The twentieth preferred embodiment of the phase shifter should theoretically obtain an output of a π/4 phase difference by the adder 103 as shown in FIG. 37. In practice, the output of the adder 103 may have the π4 phase shift due to the phase difference of the π/2 phase shifter 102, the error in the output level or the like. In order to correct this, the twenty-first through twenty-third preferred embodiments of a phase shifter according to the present invention will be described referring to FIGS. 38 through 40.

The twenty-first preferred embodiment of the phase shifter shown in FIG. 38 takes only direct-current components out of the output of a limiter 104 using an adder 110 and a low-pass filter (LPF) 112. In addition, the output of a limiter 105 is multiplied by the π/4 phase-shifted output of the limiter 104 by means of a multiplier 111, and thereafter, the direct-current components thereof are taken out by a LPF 113 to be multiplied by √2 by means of an amplifier 114. The outputs of the LPF 112 and the amplifier 114 are compared by means of a comparator 115, the output of which corrects the amplitude of cos(bit) of the π/2 phase shifter.

With this construction, the operation will be described below.

If the difference between the outputs of the limiters 104 and 105 is less than π/4, the output of the amplifier 114 is greater than the output of the LPF 112, so that the amplitude of cos(ωt) is controlled to be increased by means of the comparator 115 and the variable amplifier 116 so that the phase difference between the outputs of the limiters 104 and 105 is π/4. On the other hand, when the phase difference between the outputs of the limiter 104 and 105 is greater than π/4, the amplitude of cos(ωt) is controlled to be decreased by means of the comparator 115 and the variable amplifier 116 so that the phase difference is π4.

In the twenty-second preferred embodiment of the phase shifter shown in FIG. 39, the outputs of an amplifier 114 and a LPF 112 are compared by means of a comparator 115, and a variable amplifier 117 is provided for correcting the output of sin(ωt) among the output of a π/2 phase shifter. With this construction, when the phase difference between the outputs of limiters 104 and 105 is less than π/4, the amplitude of sin(ωt) is corrected to be decreased so that the phase difference is π/4, and when the phase difference between the limiters 104 and 105 is greater than π/4, the amplitude of sin(ωt) is corrected to be increased so that the phase difference is π/4.

Figure 40:
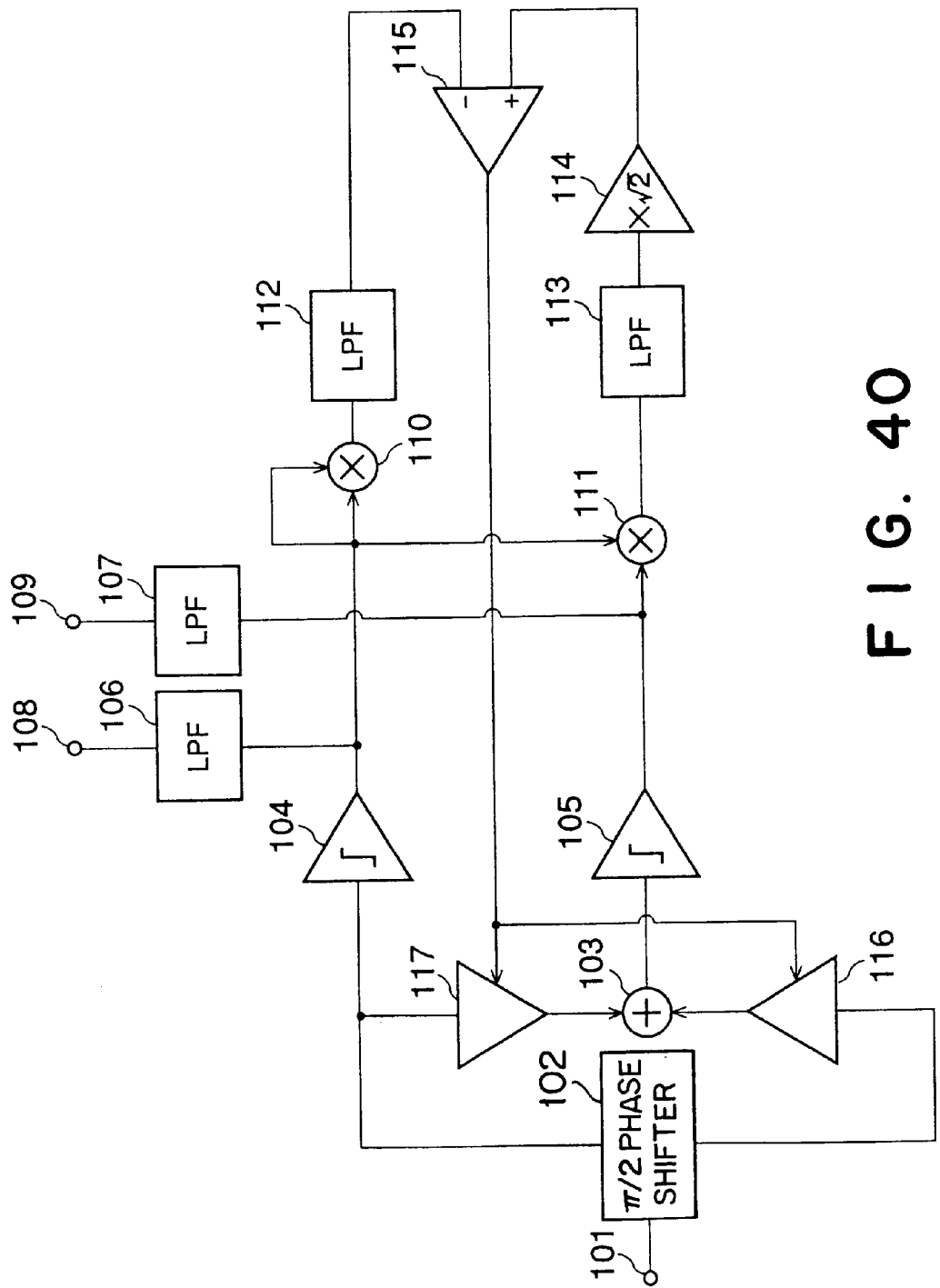
FIG. 40 is a block diagram of the twenty-third preferred embodiment of a phase shifter according to the present invention.

Furthermore, in the twenty-third preferred embodiment of the phase shifter shown in FIG. 40, both of the variable amplifiers 116 and 117 in the twenty-first and twenty-second preferred embodiments of the phase shifters are provided for correcting both of sin(ωt) and cos(ωt) to control the phase difference of the output of the π/2 phase shifter 102. That is, when the phase difference between the outputs of the limiters 104 and 105 is less than ω/4, the amplitude of cos(ωt) is corrected to be increased and the amplitude of sin(ωt) is corrected to be decreased, and when the phase shift between the outputs of the limiters 104 and 105 is greater than π/4, the amplitude of cos(ωt) is corrected to be decreased and the amplitude of sin(ωt) is corrected to be increased.

Figure 42:
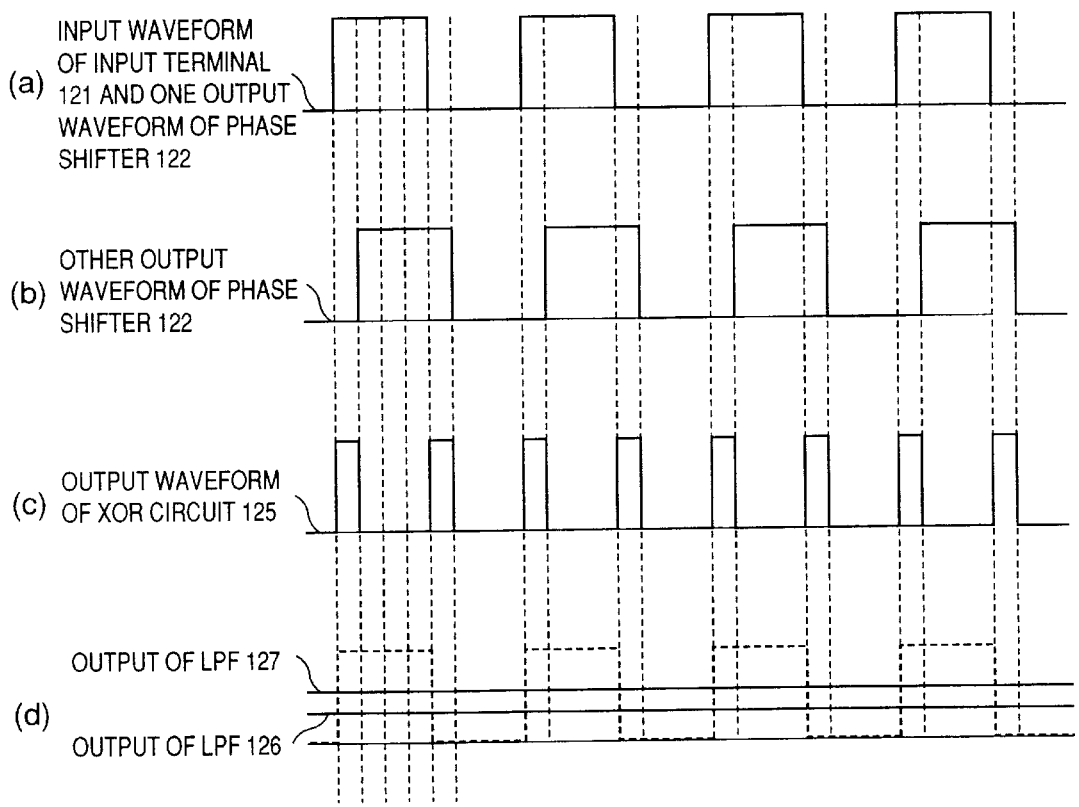
FIG. 42 is a view illustrating waveforms for explaining the operations of the respective parts of the phase shifter of FIG. 41.

Referring to FIGS. 41 and 42, the twenty-fourth preferred embodiment of a phase shifter according to the present invention will be described below.

In FIG. 41, rectangular waves as shown in FIG. 42(a) are inputted to an input terminal 121. A variable phase shifter 122 comprising a variable delay element and so forth is connected to the input terminal 121. The variable phase shifter 122 varies the phase-shifted amount depending upon the output of a comparator 129. Buffers 123 and 124 are connected to the variable phase shifter 122 so that output terminals 130 and 131 can obtain outputs of π/4 phase difference. An exclusive "or" (XOR) circuit 125 is also connected to the variable phase shifter 122 for correcting the divergence in phase difference between both outputs. Only low-frequency components are taken out of the output of the XOR circuit by means of a LPF 126. In addition, only low-frequency components are taken out of the same signal components as those supplied to the buffer 124, by means of a LPF 127, so as to be supplied to a comparator 129. Moreover, the output of the LPF 126 is amplified to be doubled by means of an amplifier 128, and then, it is supplied to the comparator 129 to be compared with the output of the LPF 127.

In the aforementioned construction, a rectangular wave signal (FIG. 42(a)) inputted to the input terminal 121 is directly outputted by means of the variable phase shifter 122 to be supplied to one terminal of the XOR circuit 125 as well as to the buffer 123. In addition, the other output of the variable phase shifter 122 is supplied to the other terminal of the XOR circuit 125 and the buffer 124 as a rectangular wave signal delayed by ¼ as shown in FIG. 42(b). The output of the XOR circuit 125 is shown in FIG. 42(c). When only low-frequency components of the output of the XOR circuit 125 and the other output of the variable phase shifter 122 pass through the LPFs 126 and 127 to take out only direct-current components, two levels can be obtained as shown in FIG. 42(d).

Since the level of the output of the LPF 126 is half of the level of the output of the LPF 127, when it is amplified to be doubled by means of the amplifier 128, the outputs of the LPF 127 and the amplifier 128 are the same level. The outputs of the LPF 127 and the amplifier 128 are inputted to two input terminals of the comparator 129 to be compared therein. When there is a difference between both inputs, the comparator 129 outputs a correction signal to the variable phase shifter 122 to correct so that the phase-shifted amount of the phase shifter 122 is π/4. The corrected two outputs of the variable phase shifter 122 are outputted from the output terminals 130 and 131 via the buffers 123 and 124.

Figure 43:
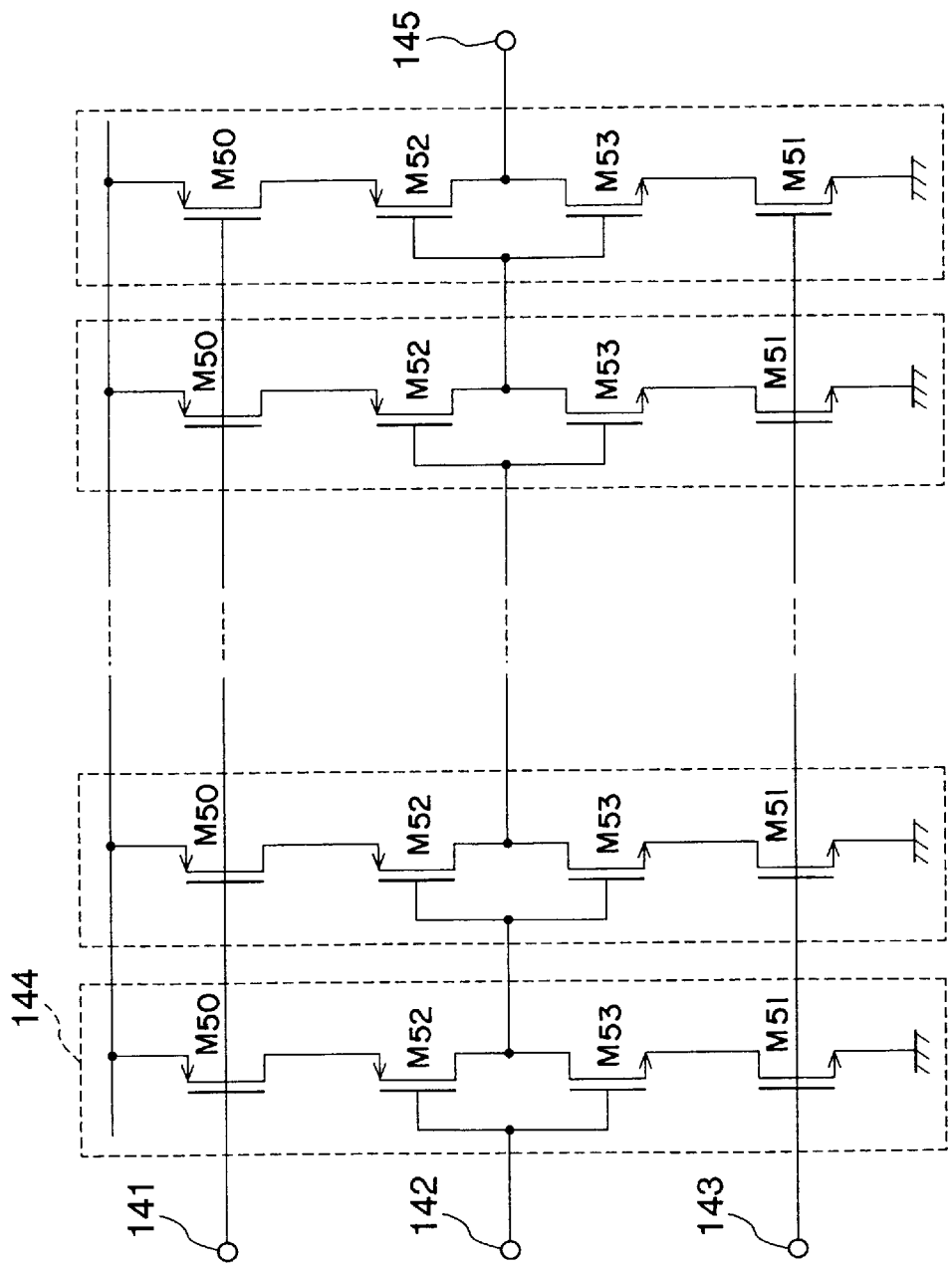
FIG. 43 is a circuit diagram of the twenty-fifth preferred embodiment of a π/2 phase shifter, which serves as a specific embodiment of FIG. 41.
Figure 44:
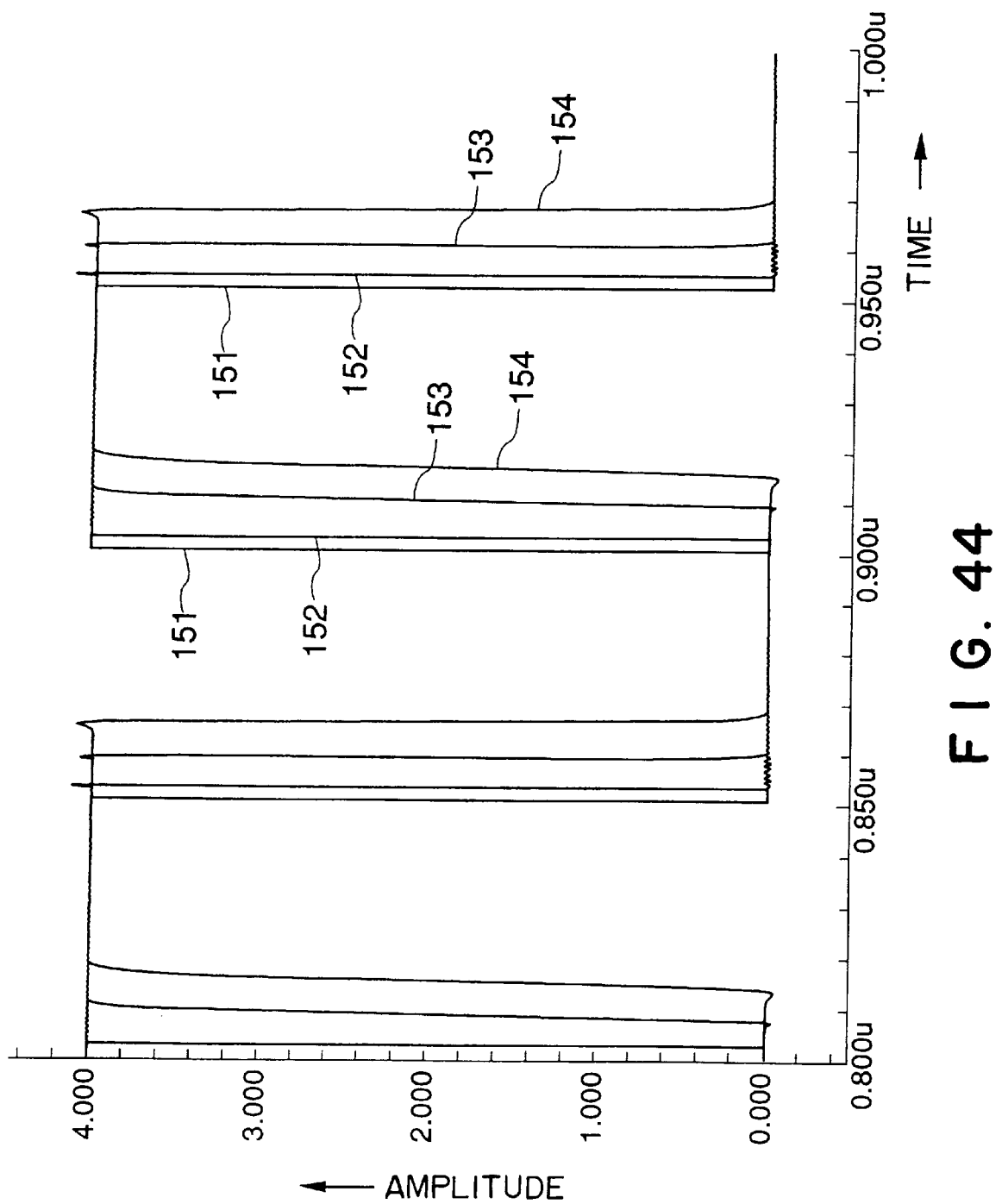
FIG. 44 is a characteristic view showing the operation of the twenty-fifth preferred embodiment of the phase shifter according to the present invention.

The specific constructions of the variable phase shifter 125 in the twenty-fourth preferred embodiment of the phase shifter can be realized by the twenty-fifth preferred embodiment of a phase shifter according to the present invention, which uses an inverter as shown in FIG. 43. Each of inverters is constructed by transistors M52 and M53, and includes a transistor M50 operating as a current source for limiting the current flowing into the transistor M52, and a transistor M51 operating as a current source for limiting the current flowing into the transistor M51. In FIG. 42, control terminals 141 and 143 are gates of the transistors M50 and M51, respectively, in order to change the current flowing in each of inverters by controlling the voltage supplied to the control terminals 141 and 143. The change of current can change the amount of phase shifting of the output signal by changing the delay time of the inverter. FIG. 43 shows a simulation result of the phase shifter which is formed by ten stages of inverters. In FIG. 43, numeral 151 denotes a waveform of an input signal, and 152 through 154 denote waveforms of inverters when the voltage supplied to the control terminals 141 and 143 is controlled and when the current flowing in the inverters is controlled. Thus, it is possible to realize a phase shifter by a cascade connection in which the plural of inverters are connected with one another in multistage for controlling the current flowing in the inverters.

With this construction, the radio receiver must limit gain in accordance with the intensity of an incoming signal. In a case where the amplitude of a high-frequency signal is controlled, noises are increased even if the gains of a variable-gain amplifier circuit and/or a variable attenuating circuit are maximum (the attenuating amount is small). On the other hand, the amplitude of a local oscillation signal is controlled, it is possible to prevent the increase of noises by suppressing the even-times wave noises. Therefore, it is possible to provide a radio receiver which has a small amount of noise and a high sensitivity.

What is claimed is:

1. A frequency converter comprising:
   a first comparator for inputting a first input signal to a first input terminal and for inputting a second input signal to a second input terminal, to compare the first and second input signals;
   a second comparator for inputting the second input signal to a first input terminal and for inputting an inverted signal of the first input signal to a second input terminal, to compare the inputted signals; and
   a filter for inputting outputs of the first and second comparators to synthesize the first and second signals to remove an unnecessary signal component to output only a desired signal component.

2. A frequency converter comprising:
   a first two-terminal non-linear element which includes a first terminal connected to a first terminal of a second two-terminal non-linear element, and a second terminal for inputting a first input signal; and
   the second two-terminal non-linear element which includes the first terminal connected to the terminal of the first two-terminal non-linear element, and a second terminal for inputting a second input signal,
   wherein an output signal is taken out by the second terminal of any one of the first and second two-terminal non-linear elements.

3. A frequency converter as set forth in claim 2, wherein each of said first and second two-terminal non-linear elements comprises a variable-capacity diode.

4. A frequency converter comprising:
   a first two-terminal non-linear element having a second terminal for inputting one of first and second input signals;
   a second two-terminal non-linear element having a second terminal for inputting the other of the first and second input signals; and
   bias supplying means having an output terminal, to which first terminals of the first and second two-terminal non-linear elements,
   wherein an output signal is taken out by any one of the second terminals of the first and second two-terminal non-linear elements.

5. A frequency converter as set forth in claim 4 wherein each of said first and second two-terminal non-linear elements comprises a diode.

6. A frequency converter comprising:
   a first signal synthesizer means for inputting a first input signal and a second input signal to synthesize the first and second input signals to output a first synthesized signal;
   a first amplitude limitation amplifier means for amplifying the first synthesized signal outputted from the first signal synthesizer means, to output a first amplified signal having a constant amplitude;
   a second signal synthesizer means for inputting inverted signals of the first and second input signals to synthesize the inverted signals of the first and second input signals to output a second synthesized signal;
   a second amplitude limitation amplifier means for amplifying the second synthesized signal outputted from the second signal synthesizer means, to output a second amplified signal having a constant amplitude; and
   a filter for inputting the first and second amplified signals outputted from the first and second amplitude limitation amplifier means, to synthesize the first and second amplified signals to remove an unnecessary signal component to output only a desired signal component.

7. A frequency converter comprising:
   a first comparator means for inputting a first input signal to a first terminal and for inputting a second input signal to a second terminal, to compare the first and second input signals;
   a second comparator means for inputting the second input signal to a first terminal and for inputting the first input signal to a second terminal, to compare the inputted signals;
   gain control means for controlling small signal gains of the first and second comparator means; and
   filter means for inputting outputs of the first and second comparator means to synthesize the signals to remove an unnecessary signal component to output a desired signal component.

8. A frequency converter as set forth in claim 7, wherein said gain control means controls said small signal gains by controlling bias currents of said first and second comparator means.

9. A frequency converter as set forth in claim 7, wherein said gain control means controls said small signal gains by adding a DC offset to the first input signal and the inverted signal of the first input signal.

10. A radio receiver using a frequency converter, which comprises:
    a high-frequency distributor circuit for inputting a high-frequency signal to divide the inputted high-frequency signal into two high-frequency signals to output two distributed high-frequency signals;
    a first even higher-harmonic frequency converter for inputting one of the high-frequency signals distributed by the high-frequency distributor circuit, to convert the frequency thereof, said first even higher-harmonic frequency converter having at least one differential pair of transistors;
    a second even higher-harmonic frequency converter for inputting the other the high-frequency signal distributed by the high-frequency distributor circuit, to convert the frequency thereof, said second even higher-harmonic frequency converter having at least one differential pair of transistors; and an orthogonal demodulator for inputting a local oscillation signal, said orthogonal demodulator including a local oscillation distributor circuit for distributing local oscillation signals, each of which has a different phase from another by π/4, to the first even higher-harmonic frequency converter and the second even higher-harmonic frequency converter.

11. A radio receiver having a frequency converter, as set forth in claim 10, wherein said local oscillation distributor circuit comprises:

a variable phase-shifter circuit;

an exclusive "or" circuit for calculating an exclusive OR of an input signal and an output signal of the variable phase-shifter circuit;

a first low-pass filter for detecting a direct-current component level of an output signal of the exclusive "or" circuit;

a second low-pass filter for detecting a direct-current component level of an input signal of the variable phase-shifter circuit;

an amplifier circuit for amplifying an output signal of the first low-pass filter;

a comparator circuit for comparing an output signal of the amplifier circuit with an output signal of the second low-pass filter to amplifier a difference therebetween; and first and second buffers for inputting input signals of the variable phase-shifter circuit to output the input signals to the first and second even higher-harmonic frequency converters, wherein the phase-shifted amount of the phase-shifter circuit is controlled by the output of the comparator circuit.

12. A radio receiver using a frequency converter, as set forth in claim 11, wherein each of said first and second buffers has a function to convert an input signal to a triangular wave.

13. A radio receiver using a frequency converter, as set forth in claim 11, wherein said phase-shifter circuit comprises a M-stage inverter circuit (M is an even number).

14. A radio receiver using a frequency converter, as set forth in claim 10, wherein said local oscillation distributor circuit comprises:

first and second resistors connected in series for inputting a local oscillation signal;

a third resistor and a first capacitor connected in series for inputting a local oscillation signal;

a third filter for limiting the amplitude of a signal at a connection point at which the first resistor is connected to the second resistor in series, to remove a higher harmonic component of the signal to supply the higher harmonic component to any one of the first and second even higher-harmonic frequency converters; and a fourth filter for limiting the amplitude of a signal at a connection point at which the third resistor is connected to the first capacitor in series, to remove a higher harmonic component of the signal to supply the higher harmonic component to the other of the first and second even higher-harmonic frequency converters.

15. A radio receiver using a frequency converter, as set forth in claim 10, wherein said local oscillation signal distributor circuit comprises:

first and second resistors connected in series for inputting a local oscillation signal;

a third resistor and a first capacitor connected in series for inputting a local oscillation signal;

a first buffer for supplying a signal at a connection point, at which the first resistor is connected to the second resistor in series, to one of the first and second even higher-harmonic frequency converters; and a second buffer for supplying a signal at a connection point, at which the third resistor is connected to the first capacitor in series, to the other of the first and second even higher-harmonic frequency converters, wherein the resistance of the first resistor is about ($\sqrt{2}-1$) times as large as the resistance of the second resistor.

16. A radio receiver using a frequency converter, comprising:

signal synthesizer means for inputting first and second input signals to synthesize the first and second input signals to output a synthesized signal;

amplitude limitation amplifier means for amplifying the synthesized signal outputted from the signal synthesizer means, to output an amplified signal having a constant amplitude; and filter means for inputting the amplified signal outputted from the amplitude limitation amplifier means, to remove an unnecessary signal component of the amplified signal to produce and output a desired signal component, wherein gain control is performed by inputting an output of a local oscillator to a variable attenuator or a variable gain amplifier.

17. A radio receiver using a frequency converter, as set forth in claim 11, wherein the rate of change to time of at least one signal of a rising edge and a falling edge of an output waveform of said local oscillator is substantially constant for a rise time or a fall time.

18. A radio receiver using a frequency converter, as set forth in claim 11, wherein the output of said local oscillator is a triangular wave.

* * * * *